US012316987B2

(12) United States Patent
Iida

(10) Patent No.: US 12,316,987 B2
(45) Date of Patent: May 27, 2025

(54) SOLID-STATE IMAGING DEVICE

(71) Applicant: SONY SEMICONDUCTOR SOLUTIONS CORPORATION, Kanagawa (JP)

(72) Inventor: Satoko Iida, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 215 days.

(21) Appl. No.: 17/998,250

(22) PCT Filed: Mar. 29, 2021

(86) PCT No.: PCT/JP2021/013354
§ 371 (c)(1),
(2) Date: Nov. 8, 2022

(87) PCT Pub. No.: WO2021/235101
PCT Pub. Date: Nov. 25, 2021

(65) Prior Publication Data
US 2023/0224602 A1    Jul. 13, 2023

(30) Foreign Application Priority Data

May 20, 2020    (JP) .................................. 2020-088488

(51) Int. Cl.
*H04N 25/63*    (2023.01)
*H04N 25/59*    (2023.01)
(Continued)

(52) U.S. Cl.
CPC ............. *H04N 25/63* (2023.01); *H04N 25/59* (2023.01); *H04N 25/771* (2023.01);
(Continued)

(58) Field of Classification Search
CPC ...... H04N 25/63; H04N 25/59; H04N 25/771; H04N 25/778; H04N 25/677; H04N 25/62;
(Continued)

(56) References Cited

U.S. PATENT DOCUMENTS

2013/0009224 A1*    1/2013    Ohri .................. H01L 27/14656
257/292
2016/0056199 A1    2/2016    Kim et al.
(Continued)

FOREIGN PATENT DOCUMENTS

JP    2005-317581 A    11/2005
JP    2006-217410 A    8/2006
(Continued)

OTHER PUBLICATIONS

International Search Report and Written Opinion of PCT Application No. PCT/JP2021/013354, issued on Jun. 15, 2021, 12 pages of ISRWO.

*Primary Examiner* — Nhan T Tran
(74) *Attorney, Agent, or Firm* — CHIP LAW GROUP

(57) ABSTRACT

A solid-state imaging device includes a photoelectric converter, a transfer gate transistor, and an overflow gate transistor. The photoelectric converter is provided in a semiconductor substrate and generates photocharge. The transfer gate transistor is provided at a surface of the semiconductor substrate as a vertical transistor and reads the
(Continued)

photocharge stored in the photoelectric converter. The overflow gate transistor is provided at the surface of the semiconductor substrate as a planar transistor and transfers the photocharge overflowing from the photoelectric converter.

10 Claims, 19 Drawing Sheets

(51) Int. Cl.
*H04N 25/771* (2023.01)
*H04N 25/778* (2023.01)
*H10F 39/00* (2025.01)
*H10F 39/18* (2025.01)

(52) U.S. Cl.
CPC ..... *H04N 25/778* (2023.01); *H10F 39/80373* (2025.01); *H10F 39/182* (2025.01)

(58) Field of Classification Search
CPC ...... H04N 25/621; H04N 25/65; H04N 25/77; H01L 27/14614; H01L 27/14645; H01L 27/14603; H01L 27/14607; H01L 27/14609; H01L 27/1461; H01L 27/14612; H01L 27/14616; H01L 27/14638; H01L 27/14641; H01L 27/14643; H01L 27/14656; H01L 27/146
See application file for complete search history.

(56) References Cited

U.S. PATENT DOCUMENTS

| | | | | |
|---|---|---|---|---|
| 2016/0351606 | A1* | 12/2016 | Azami | H01L 27/14612 |
| 2018/0308895 | A1* | 10/2018 | Kim | H01L 27/14806 |
| 2019/0123093 | A1* | 4/2019 | Watanabe | H01L 27/14887 |
| 2019/0355778 | A1* | 11/2019 | Zheng | H01L 27/1463 |
| 2020/0035724 | A1* | 1/2020 | Machida | H01L 31/10 |

FOREIGN PATENT DOCUMENTS

| | | | | | |
|---|---|---|---|---|---|
| JP | 2013-016675 | A | | 1/2013 | |
| JP | 2015-082592 | A | | 4/2015 | |
| JP | 2015-153962 | A | | 8/2015 | |
| JP | 2018-147975 | A | | 9/2018 | |
| JP | 2019-169501 | A | | 10/2019 | |
| JP | 2020-021987 | A | | 2/2020 | |
| JP | 2020-027903 | A | | 2/2020 | |
| JP | 2020035916 | A | * | 3/2020 | ....... H01L 27/14603 |
| WO | 2016/136486 | A1 | | 9/2016 | |
| WO | WO-2018221261 | A1 | * | 12/2018 | ........... H01L 27/146 |
| WO | 2020/026856 | A1 | | 2/2020 | |

* cited by examiner

[FIG. 1]
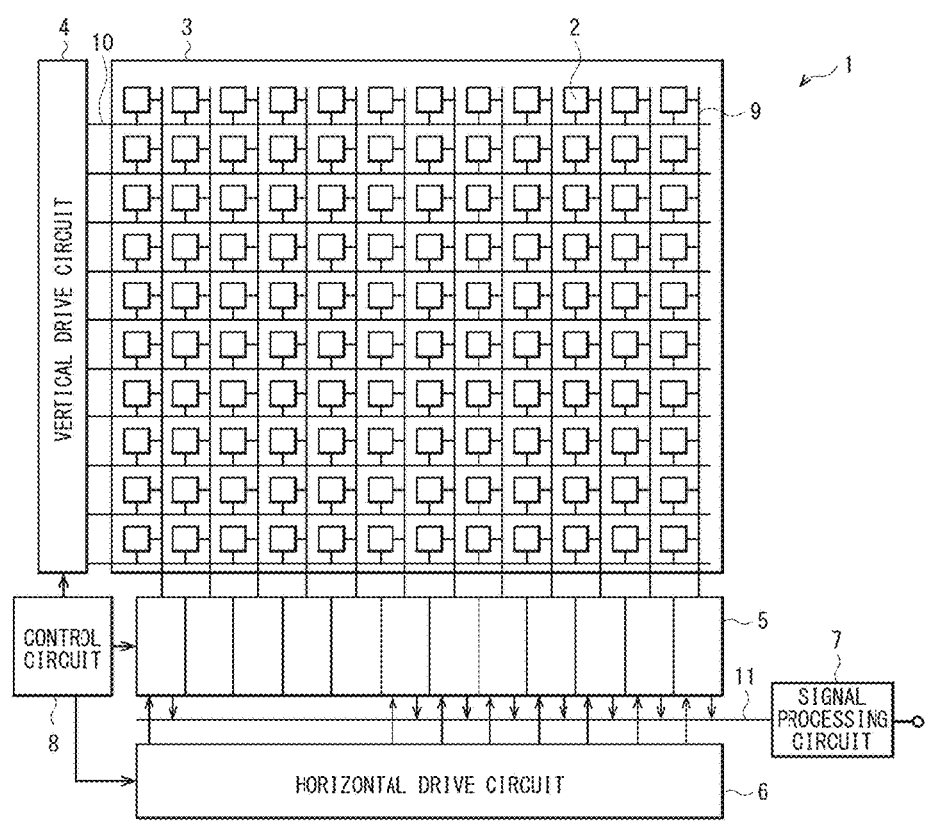

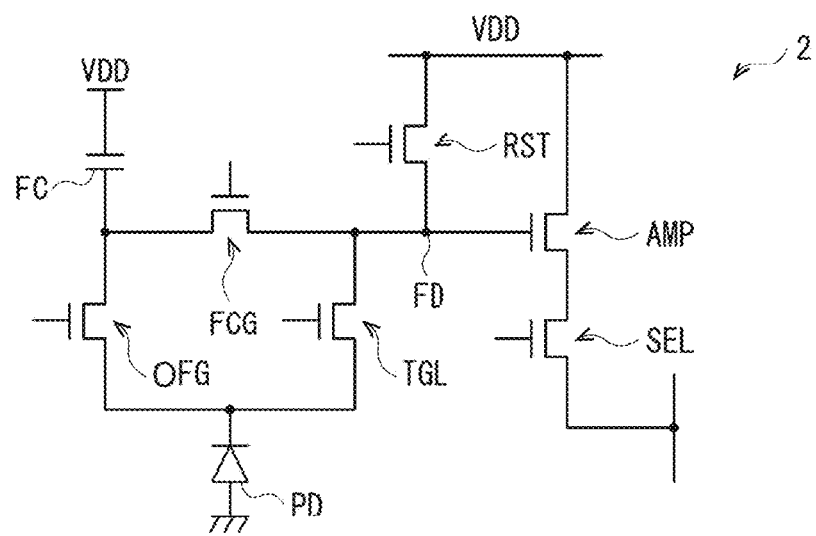
[FIG. 2]

[FIG. 3]
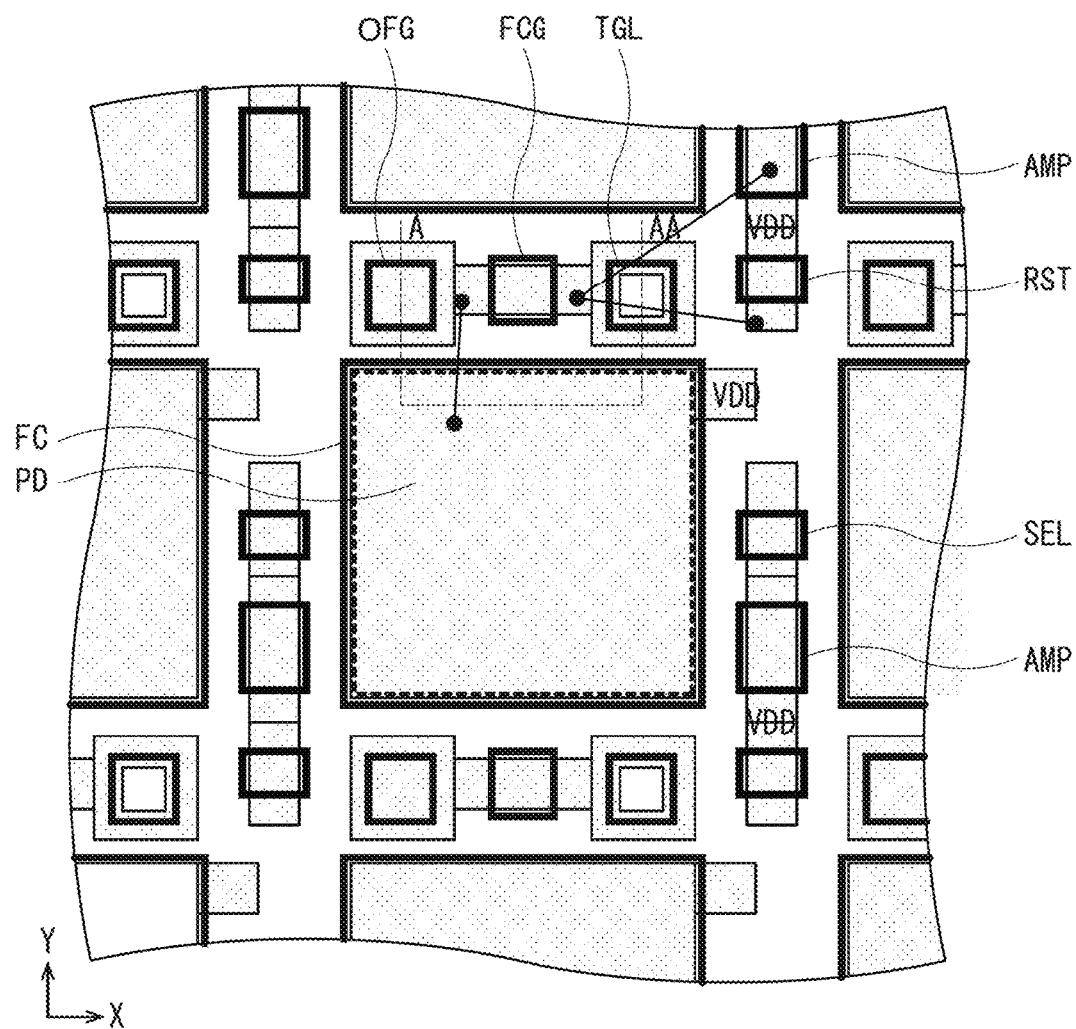

[FIG. 4]
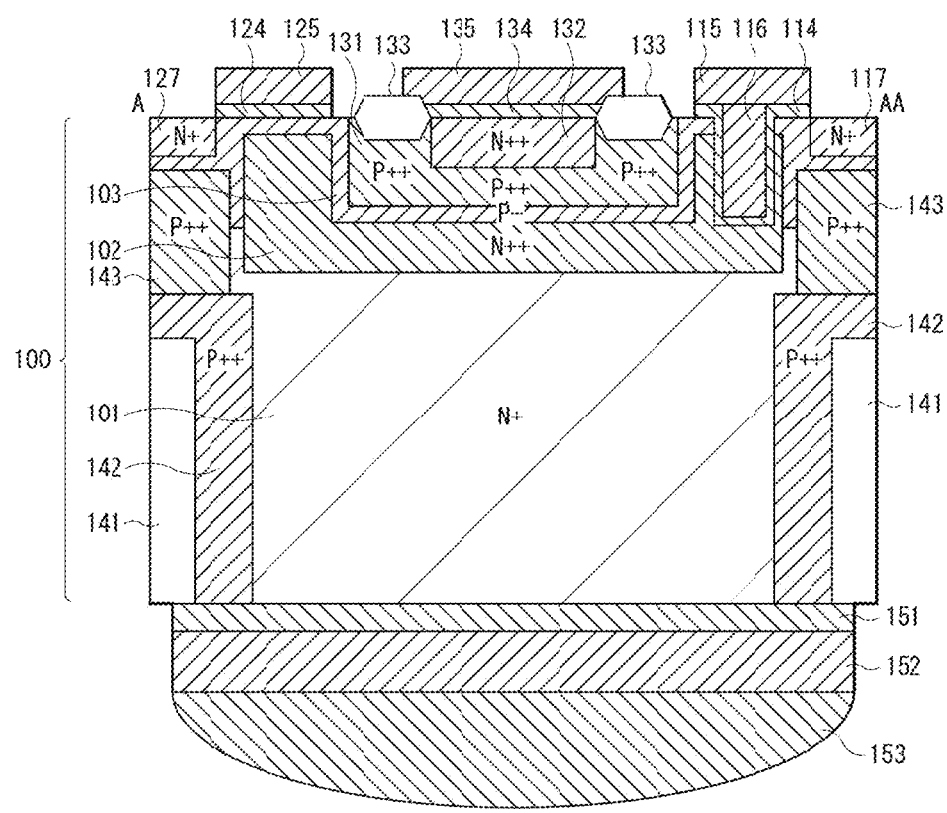

[FIG. 5]
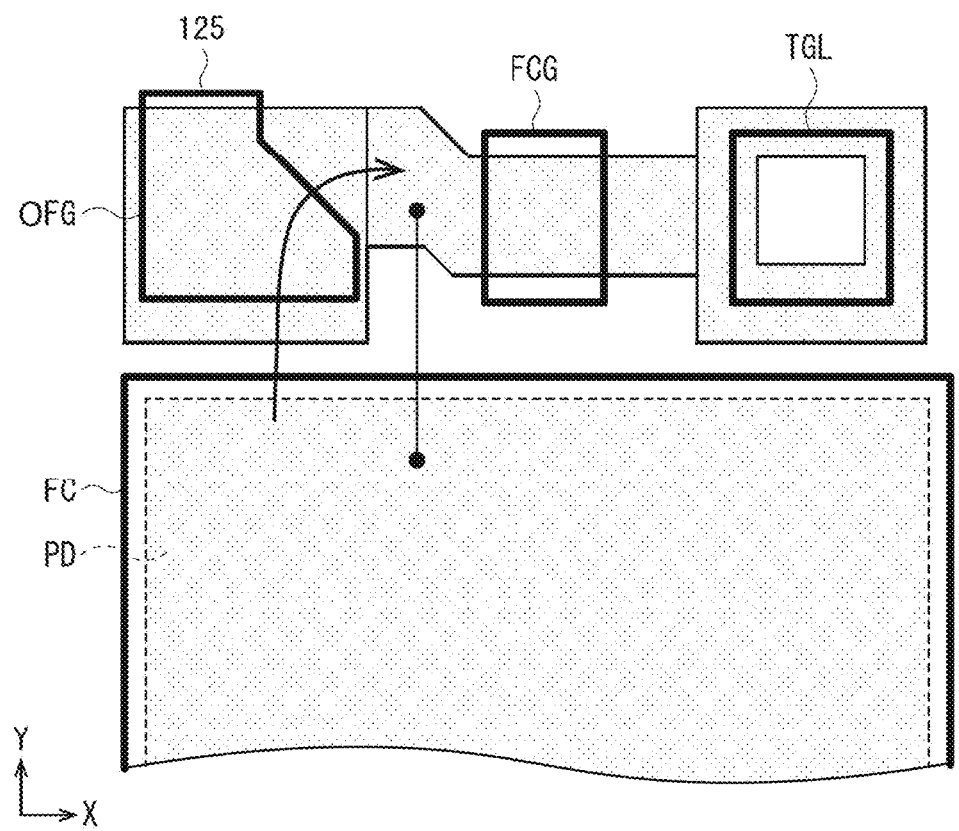

[FIG. 6]
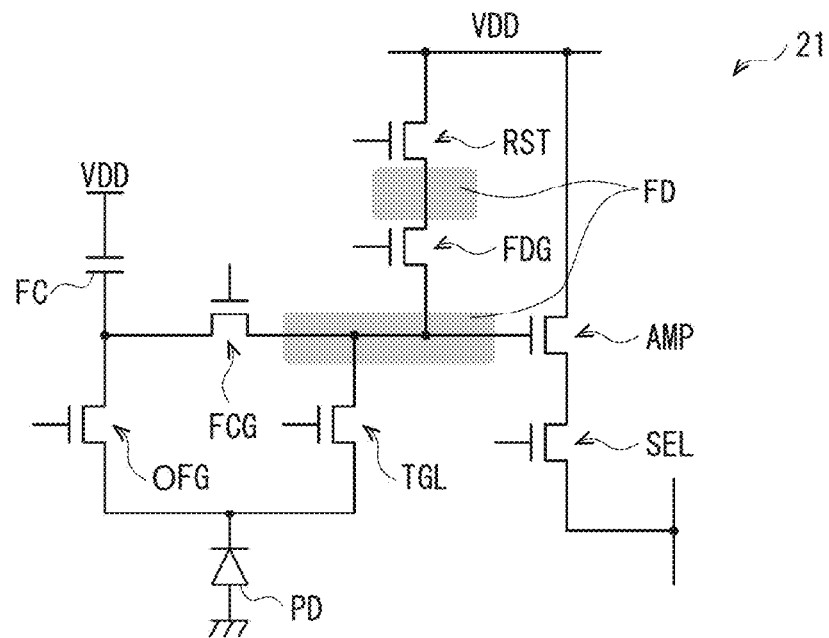
[FIG. 7]
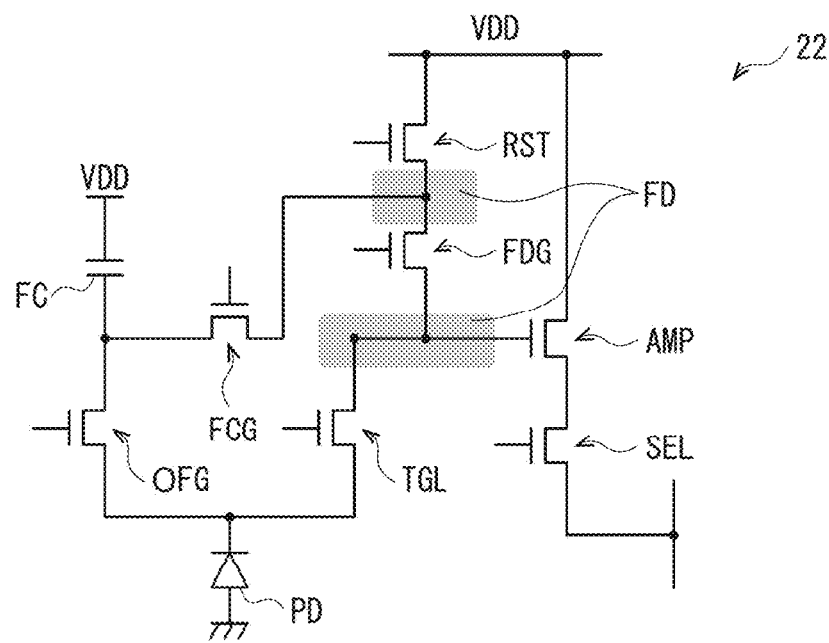

[FIG. 8]
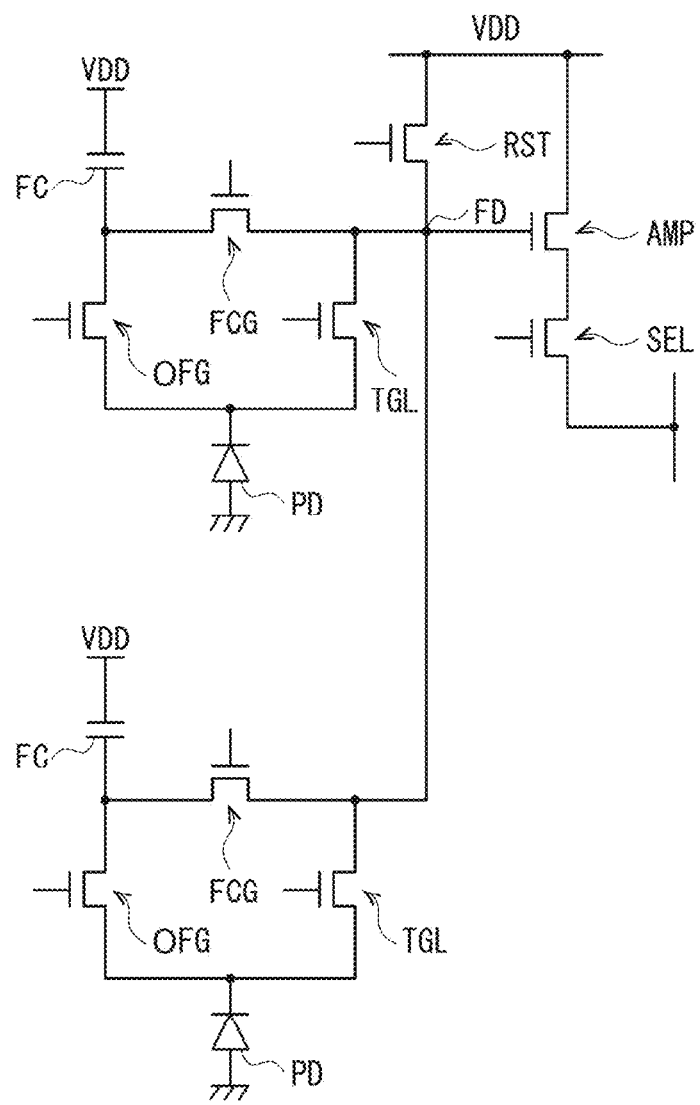

[FIG. 9]
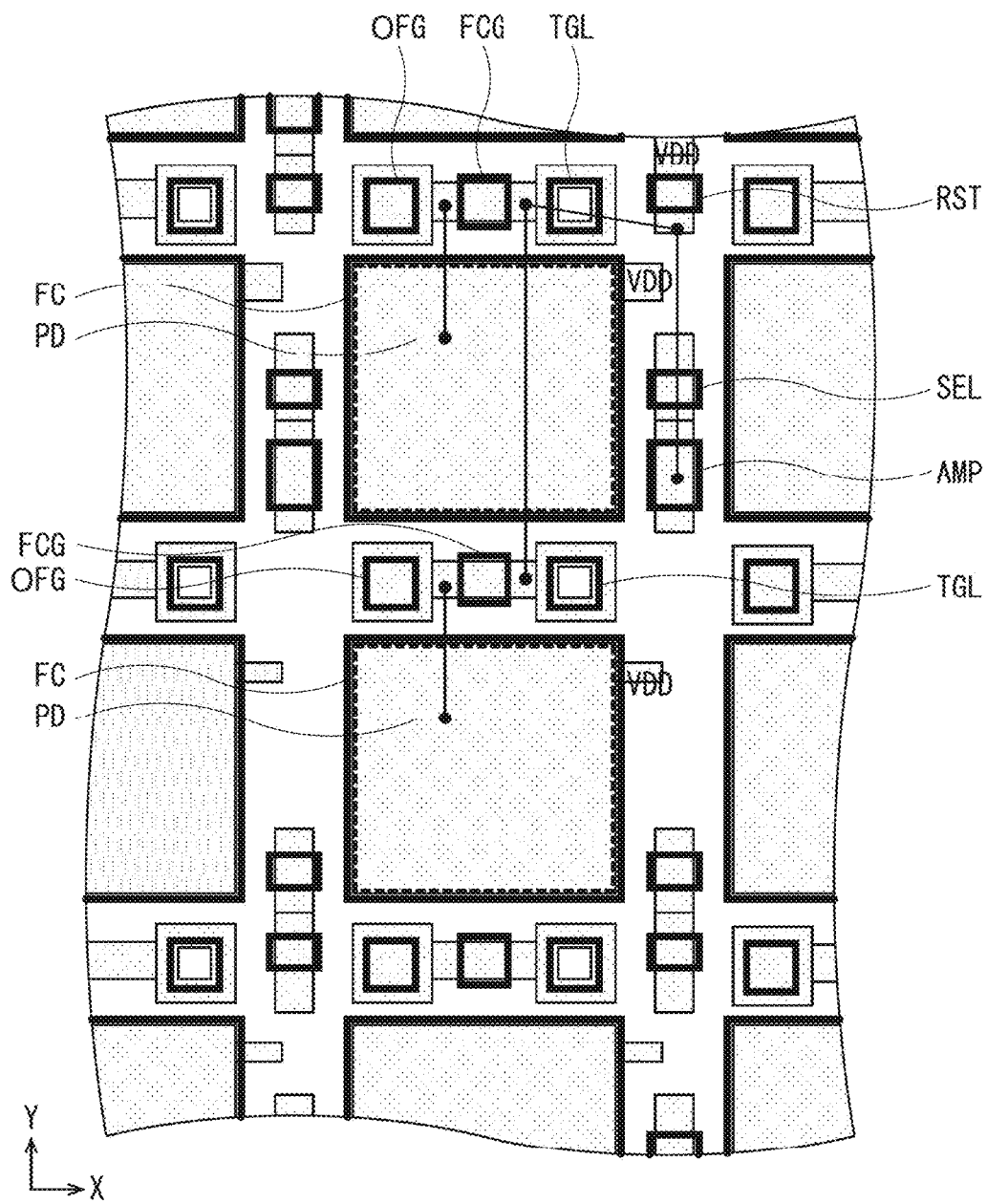

[FIG. 10]
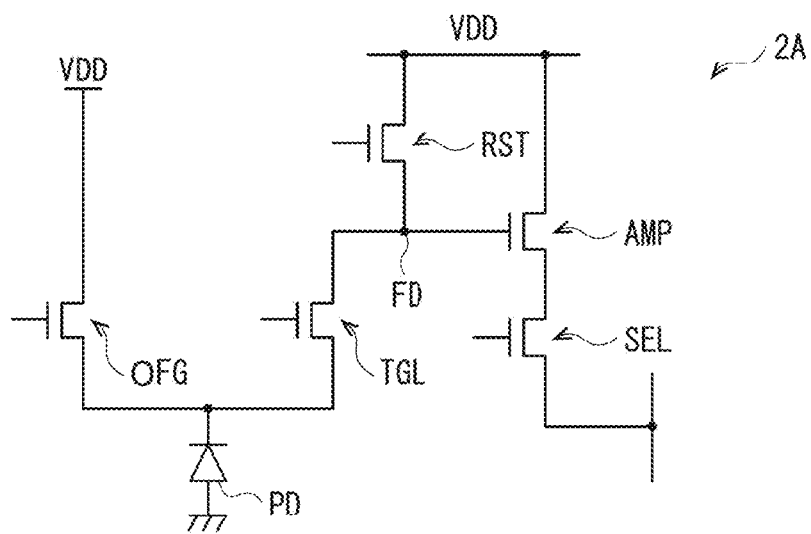

[FIG. 11]
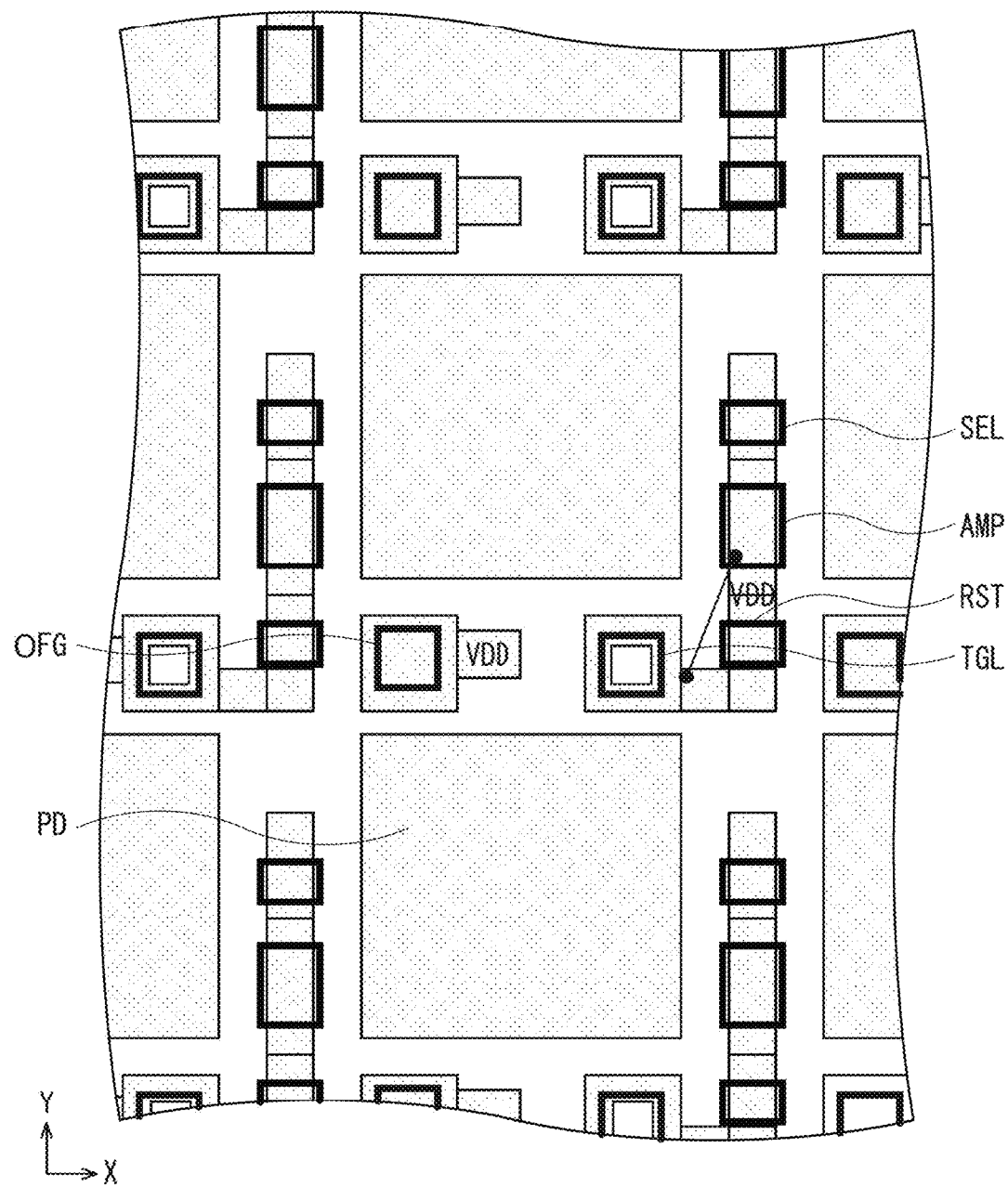

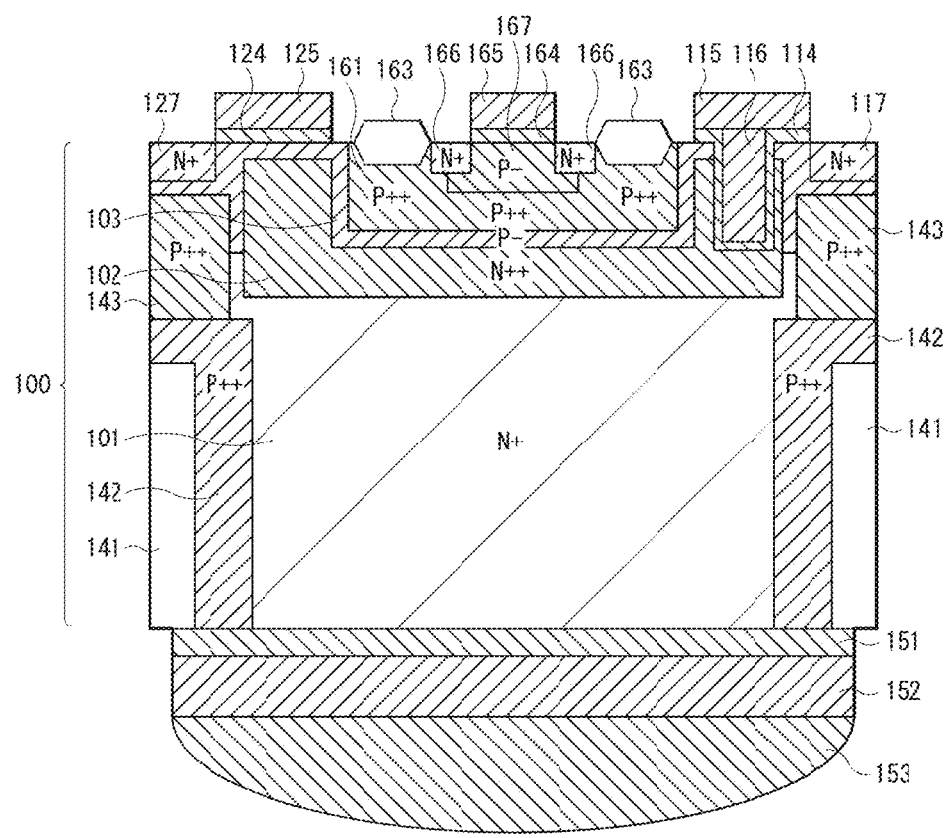
[FIG. 12]

[FIG. 13]
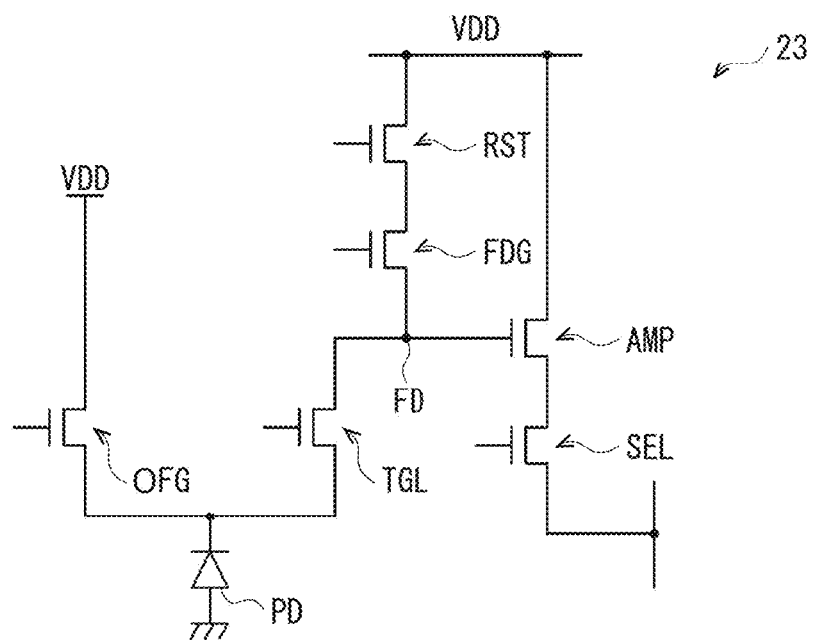

[FIG. 14]
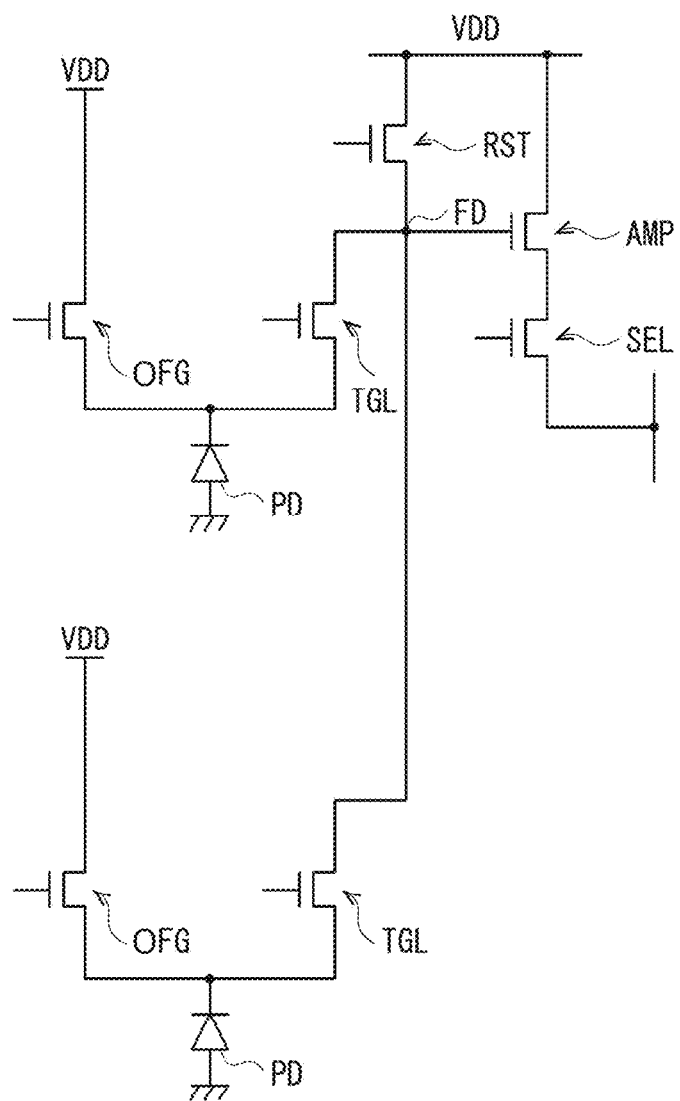

[FIG. 15]
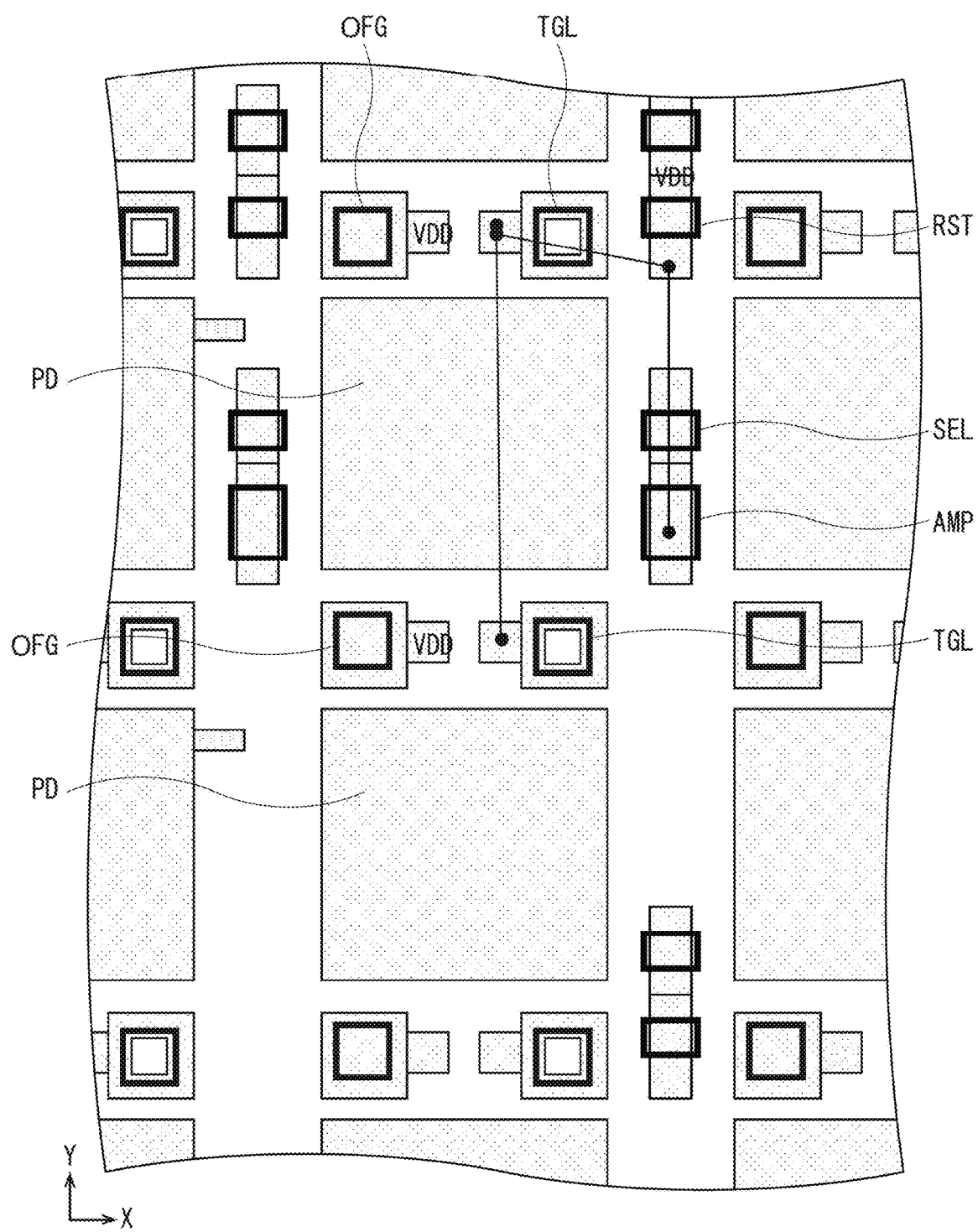

[FIG. 16]
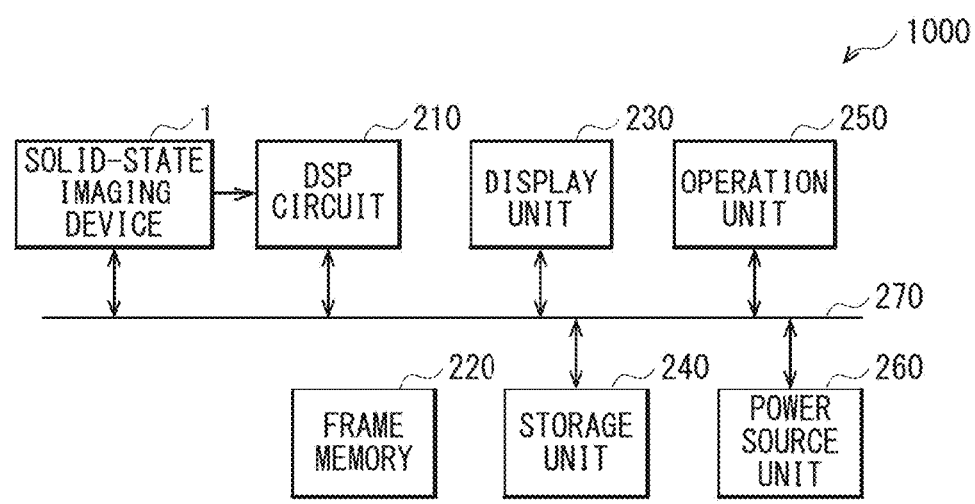

[FIG. 17]
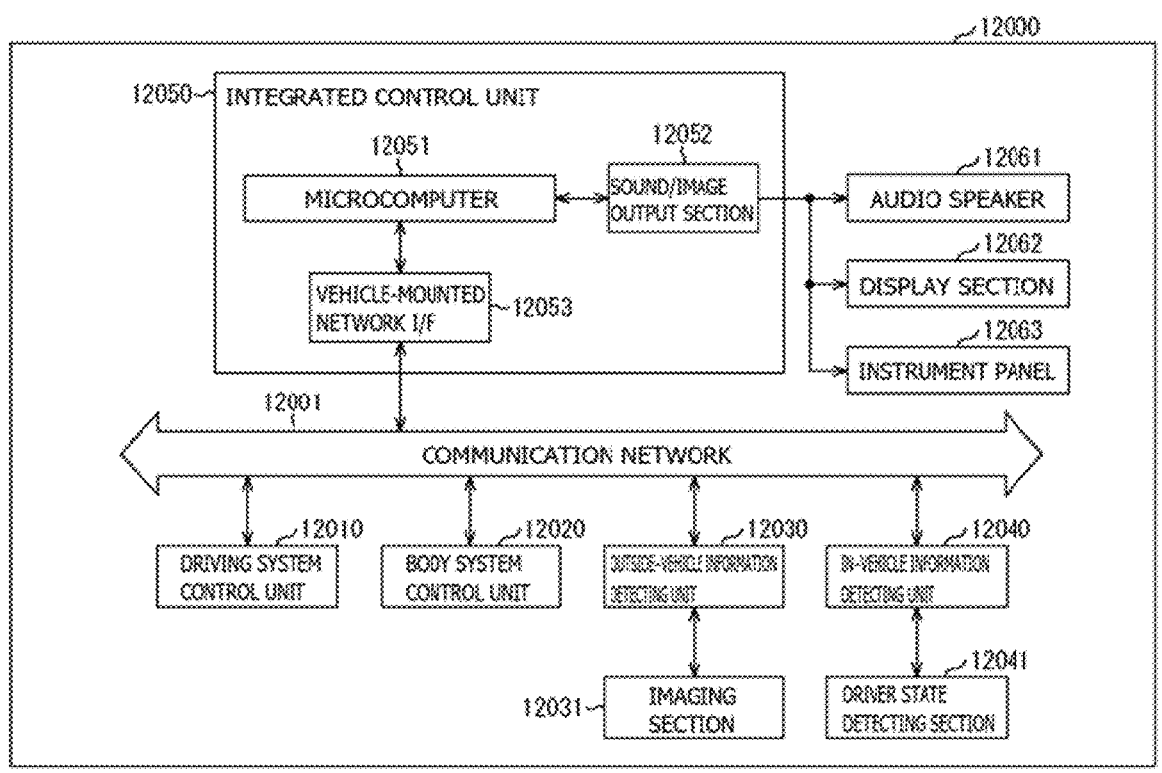

[FIG. 18]
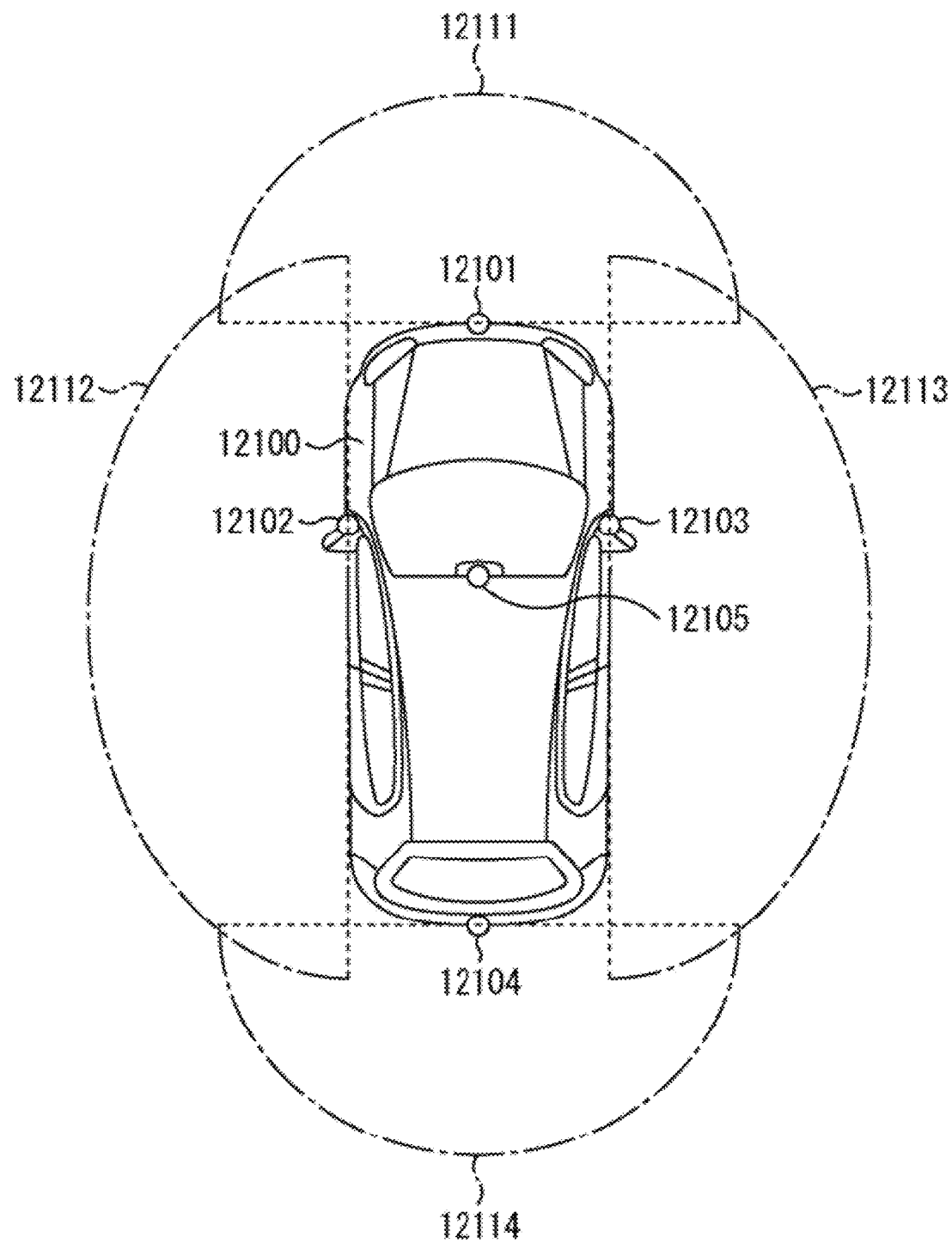

[FIG. 19]
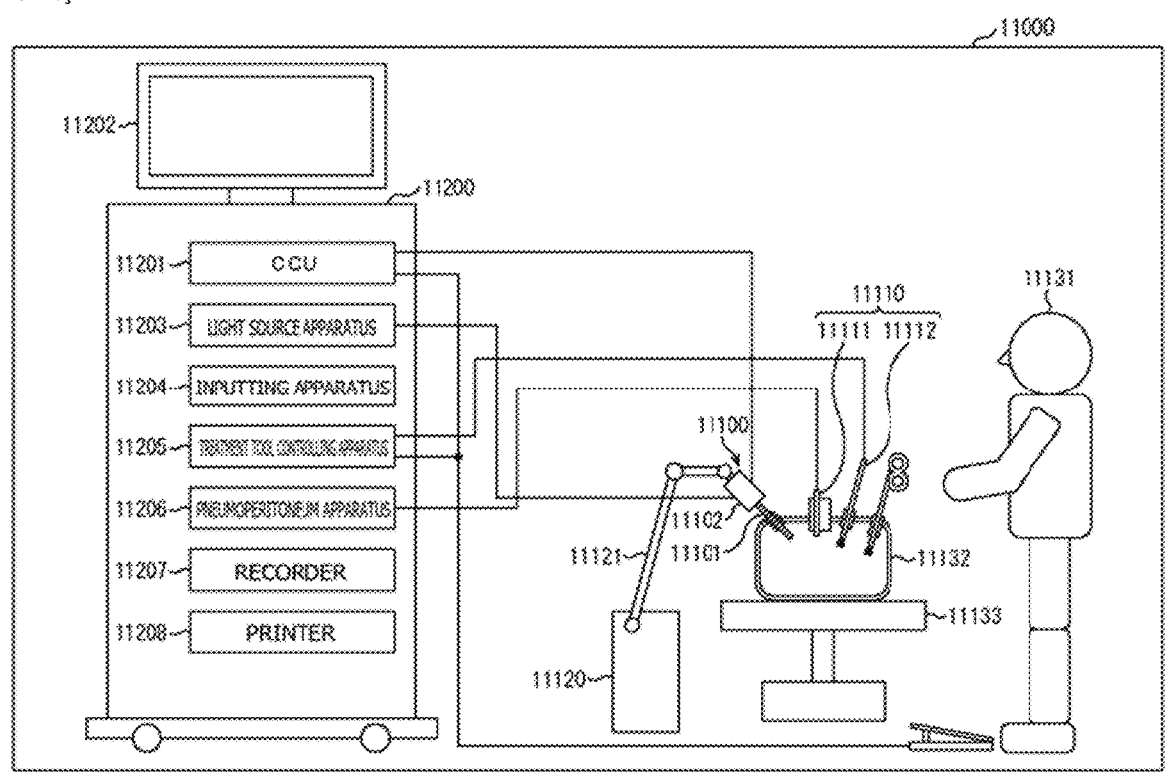

[FIG. 20]
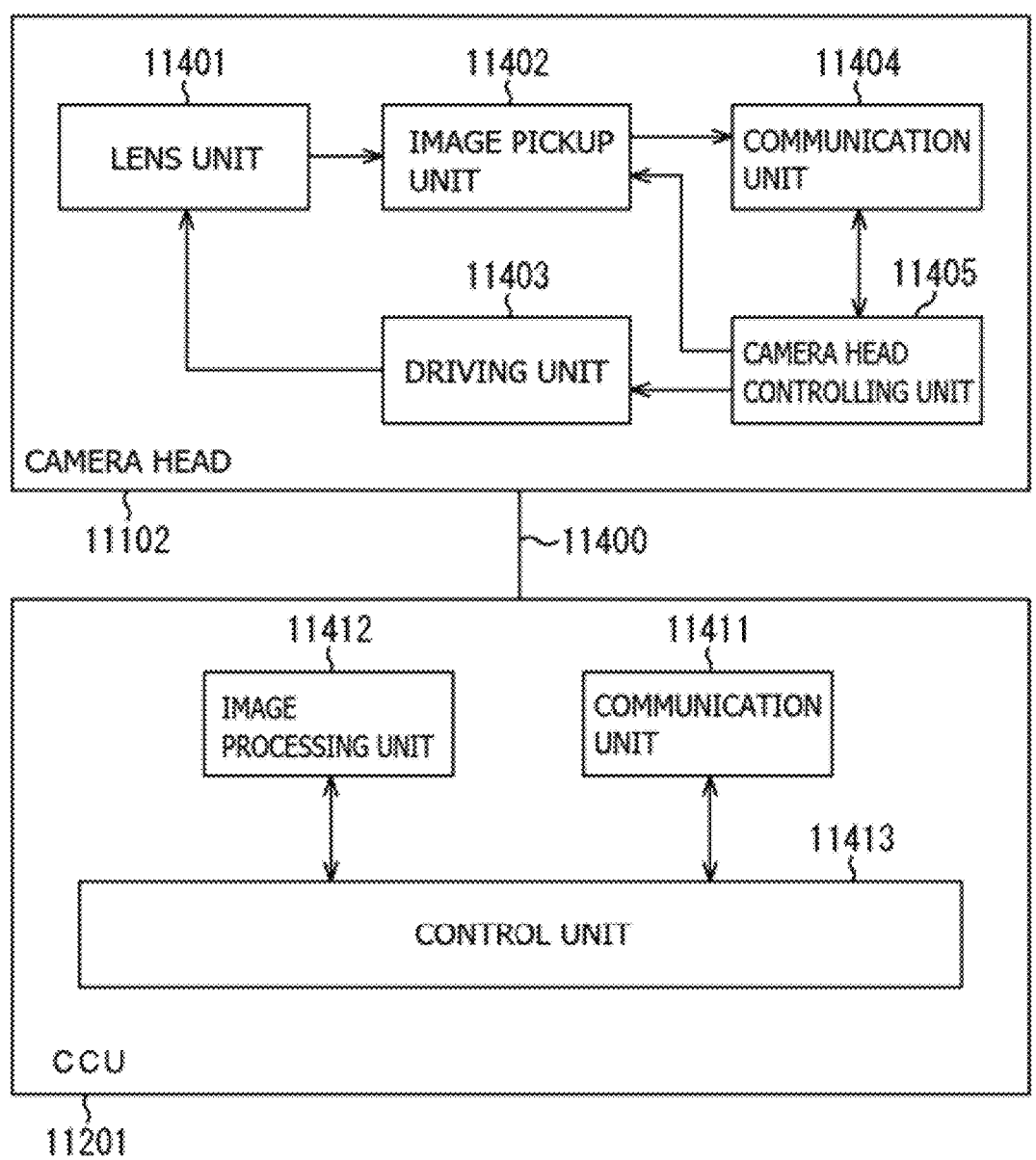

SOLID-STATE IMAGING DEVICE

CROSS REFERENCE TO RELATED APPLICATIONS

This application is a U.S. National Phase of International Patent Application No. PCT/JP2021/013354 filed on Mar. 29, 2021, which claims priority benefit of Japanese Patent Application No. JP 2020-088488 filed in the Japan Patent Office on May 20, 2020. Each of the above-referenced applications is hereby incorporated herein by reference in its entirety.

TECHNICAL FIELD

The present disclosure relates to a solid-state imaging device.

BACKGROUND ART

Recently, a solid-state imaging device such as a CMOS (Complementary Metal-Oxide-Semiconductor) image sensor or a CCD (Charge Coupled Device) image sensor has been used for various applications.

Therefore, in order to use the solid-state imaging device in a wider range of applications, it has been considered to further expand a dynamic range of the solid-state imaging device (for example, PTL 1).

CITATION LIST

Patent Literature

PTL 1: Japanese Unexamined Patent Application Publication No. 2006-217410

SUMMARY OF THE INVENTION

Such a solid-state imaging device is provided with an overflow gate transistor in addition to a transfer gate transistor. The transfer gate transistor reads photocharge as a pixel signal from a photoelectric converter (e.g., a photodiode) of the solid-state imaging device. The overflow gate transistor transfers, to a capacitor or the like, photocharge overflowing from the photodiode upon an operation of storing photocharge. The overflow gate transistor, however, can be a cause to generate a dark current. It is therefore desired to further suppress generation of a dark current in such a solid-state imaging device.

Accordingly, it is desirable to provide a solid-state imaging device that includes an overflow gate transistor and is able to suppress generation of a dark current.

A solid-state imaging device according to an embodiment of the present disclosure includes a photoelectric converter, a transfer gate transistor, and an overflow gate transistor. The photoelectric converter is provided in a semiconductor substrate and generates photocharge. The transfer gate transistor is provided at a surface of the semiconductor substrate as a vertical transistor and reads the photocharge stored in the photoelectric converter. The overflow gate transistor is provided at the surface of the semiconductor substrate as a planar transistor and transfers the photocharge overflowing from the photoelectric converter.

In the solid-state imaging device according to an embodiment of the present disclosure, the transfer gate transistor that reads the photocharge stored in the photoelectric converter is provided as a vertical transistor, and the overflow gate transistor that transfers the photocharge overflowing from the photoelectric converter is provided as a planar transistor. Accordingly, for example, the solid-state imaging device according to an embodiment of the present disclosure is able to reduce an area of an interface between a gate insulation film and the semiconductor substrate that is to be a cause to generate a dark current.

BRIEF DESCRIPTION OF DRAWINGS

FIG. 1 is a schematic diagram illustrating an outline of an overall configuration of a solid-state imaging device according to a first embodiment of the present disclosure.

FIG. 2 is a circuit diagram illustrating an equivalent circuit of a pixel in the solid-state imaging device according to the above-described embodiment.

FIG. 3 is a plan view of a plan configuration of the pixel in the solid-state imaging device according to the above-described embodiment.

FIG. 4 is a vertical cross-sectional view of a cross-sectional configuration of the pixel taken along a section line A-AA in FIG. 3.

FIG. 5 is a plan view of an example of a plan shape of a gate electrode of an overflow gate transistor.

FIG. 6 is a circuit diagram illustrating an equivalent circuit of a pixel included in a solid-state imaging device according to a first modification of the above-described embodiment.

FIG. 7 is a circuit diagram illustrating an equivalent circuit of a pixel included in the solid-state imaging device according to the first modification of the above-described embodiment.

FIG. 8 is a circuit diagram illustrating an equivalent circuit of multiple pixels included in a solid-state imaging device according to a second modification of the above-described embodiment.

FIG. 9 is a plan view of a plan configuration of the multiple pixels included in the solid-state imaging device according to the second modification of the above-described embodiment.

FIG. 10 is a circuit diagram illustrating an equivalent circuit of a pixel in a solid-state imaging device according to a second embodiment of the present disclosure.

FIG. 11 is a plan view of a plan configuration of the pixel in the solid-state imaging device according to the above-described embodiment.

FIG. 12 is a vertical cross-sectional view of a cross-sectional configuration of the pixel in the solid-state imaging device according to the above-described embodiment.

FIG. 13 is a circuit diagram illustrating an equivalent circuit of a pixel included in a solid-state imaging device according to a first modification of the above-described embodiment.

FIG. 14 is a circuit diagram illustrating an equivalent circuit of multiple pixels included in a solid-state imaging device according to a second modification of the above-described embodiment.

FIG. 15 is a plan view of a plan configuration of the multiple pixels included in the solid-state imaging device according to the second modification of the above-described embodiment.

FIG. 16 is a block diagram illustrating a configuration example of an electronic apparatus including the solid-state imaging device according to the first and second embodiments and the modifications of the present disclosure.

FIG. 17 is a block diagram depicting an example of schematic configuration of a vehicle control system.

FIG. 18 is a diagram of assistance in explaining an example of installation positions of an outside-vehicle information detecting section and an imaging section.

FIG. 19 is a view depicting an example of a schematic configuration of an endoscopic surgery system.

FIG. 20 is a block diagram depicting an example of a functional configuration of a camera head and a camera control unit (CCU).

MODES FOR CARRYING OUT THE INVENTION

In the following, a detailed description is given of some embodiments of the present disclosure with reference to the drawings. The embodiments described below are specific examples of the present disclosure, and the technology according to the present disclosure is not limited to the following embodiments. In addition, arrangements, dimensions, dimension ratios, etc. of respective components of the present disclosure are not limited to the embodiments illustrated in the respective drawings.

It is to be noted that the description is given in the following order.
1. First Embodiment
    1.1. Overall Configuration of Solid-state Imaging Device
    1.2. Configuration Example of Pixel
    1.3. Examples of Plan Shape of Gate Electrode of Overflow Gate Transistor
    1.4. Modifications
2. Second Embodiment
    2.1. Configuration Example of Pixel
    2.2. Modifications
3. Application Examples

1. First Embodiment (1.1. Overall Configuration of Solid-State Imaging Device)

First, referring to FIG. 1, described is an overall configuration of a solid-state imaging device according to a first embodiment of the present disclosure. FIG. 1 is a schematic diagram describing an outline of the overall configuration of the solid-state imaging device 1 according to the present embodiment.

As illustrated in FIG. 1, the solid-state imaging device 1 includes, for example, a pixel array section 3 and a peripheral circuit section. The pixel array section 3 includes pixels 2 that are arranged two-dimensionally in a matrix. The peripheral circuit section includes a vertical drive circuit 4, a column signal processing circuit 5, a horizontal drive circuit 6, a signal processing circuit 7, and a control circuit 8. The peripheral circuit section is provided, for example, around the pixel array section 3. Each configuration of the solid-state imaging device 1 may be provided, for example, on a substrate including a semiconductor such as silicon (Si).

The pixel 2 includes a photoelectric converter such as a photodiode, and a pixel transistor group that converts photocharge generated by the photoelectric converter into a pixel signal. The pixel transistor group includes, for example, multiple MOS (Metal-Oxide-Semiconductor) transistors including, without limitation, an amplifier transistor, a reset transistor, and a selection transistor.

The control circuit 8 generates various signals for causing the respective circuits included in the peripheral circuit section to operate, and supplies the generated various signals to the respective circuits. Specifically, the control circuit 8 generates clock signals and control signals to control operations of the vertical drive circuit 4, the column signal processing circuit 5, the horizontal drive circuit 6, etc. on the basis of a vertical synchronization signal, a horizontal synchronization signal, and a master clock. In addition, the control circuit 8 supplies the generated clock signals and control signals to the vertical drive circuit 4, the column signal processing circuit 5, and the horizontal drive circuit 6.

The vertical drive circuit 4 includes, for example, a shift register. The vertical drive circuit 4 selects a predetermined pixel driving line 10 and supplies a pulse signal for driving the pixels 2 to the selected pixel driving line 10. Thus, the vertical drive circuit 4 is able to drive the pixels 2 on a row-unit basis. In other words, the vertical drive circuit 4 sequentially selects the pixels 2 of the pixel array section 3 on the row-unit basis while scanning the pixels 2 of the pixel array section 3 in a vertical direction, and causes pixel signals based on photocharge generated by the photoelectric converters of the pixels 2 to be supplied to the column signal processing circuits 5 via vertical signal lines 9.

The column signal processing circuit 5 is provided for each column of the pixels 2, and performs signal processing on the pixel signals outputted from the pixels 2 on the basis of a column unit of the pixels 2. For example, the column signal processing circuit 5 may perform signal processing such as CDS (Correlated Double Sampling: correlated double sampling) processing or AD (Analog-Digital) conversion processing on the pixel signals outputted from the pixels 2. The CDS processing is processing to remove a fixed pattern noise unique to the pixels 2.

The horizontal drive circuit 6 includes, for example, a shift register. The horizontal drive circuit 6 sequentially selects the column signal processing circuits 5 by horizontal scanning pulse signals, and causes a pixel signal to be supplied from each of the column signal processing circuits 5 to a horizontal signal line 11.

The signal processing circuit 7 performs predetermined signal processing on the pixel signals sequentially supplied from the respective column signal processing circuits 5 via the horizontal signal line 11, and outputs the pixel signals subjected to the signal processing to an outside of the solid-state imaging device 1. For example, the signal processing circuit 7 may perform, on the pixel signals, predetermined signal processing such as dark current correction, column variation correction, or various kinds of digital signal processing, or may perform only buffering of the pixel signals.

The solid-state imaging device 1 having the above-described configuration is a CMOS image sensor of a so-called column-AD type in which the column signal processing circuit 5 is provided for each column of the pixels 2. The solid-state imaging device 1 may be, however, a CMOS image sensor of a pixel-AD type in which the column signal processing circuit 5 is provided for each of the pixels 2.

(1.2. Configuration Example of Pixel)

Next, referring to FIGS. 2 to 4, a more specific description is given of a configuration example of the pixel 2 in the solid-state imaging device 1 according to the present embodiment. FIG. 2 is a circuit diagram illustrating an equivalent circuit of the pixel 2 in the solid-state imaging device 1 according to the present embodiment. FIG. 3 is a plan view of a plan configuration of the pixel 2 in the solid-state imaging device 1 according to the present embodiment. FIG. 4 is a vertical cross-sectional view of a cross-sectional configuration of the pixel 2 taken along a section line A-AA in FIG. 3.

As illustrated in FIG. 2, the pixel 2 of the solid-state imaging device 1 according to the present embodiment includes a photodiode PD, an overflow gate transistor OFG, a storage capacitor FC, a storage capacitance transistor FCG, a transfer gate transistor TGL, a reset transistor RST, an amplifier transistor AMP, and a selection transistor SEL.

The photodiode PD is a photoelectric converter of the pixel 2. The photodiode PD performs photoelectron conversion on light incident on the pixel 2 to generate photocharge. An anode of the photodiode PD is electrically coupled to ground. A cathode of the photodiode PD is electrically coupled to a source of the overflow gate transistor OFG and a source of the transfer gate transistor TGL. The photocharge generated by the photodiode PD is taken out from the photodiode PD via the overflow gate transistor OFG and the transfer gate transistor TGL.

The overflow gate transistor OFG transfers photocharge overflowing from the photodiode PD to the storage capacitor FC. The source of the overflow gate transistor OFG is electrically coupled to the cathode of the photodiode PD. A drain of the overflow gate transistor OFG is electrically coupled to the storage capacitor FC and a source of the storage capacitance transistor FCG.

Specifically, the overflow gate transistor OFG is so provided that a potential of a channel of the overflow gate transistor OFG is deeper than that of the transfer gate transistor TGL (in other words, so that the potential of the channel shifts more in a positive direction), thereby forming an overflow path of the photocharge from the photodiode PD. Thus, in a case where photocharge more than a saturation charge amount is generated by the photodiode PD, the solid-state imaging device 1 is able to cause the photocharge exceeding the saturation charge amount to overflow (overflow) into the storage capacitor FC via the overflow gate transistor OFG.

The storage capacitor FC is, for example, a capacitor, and holds the photocharge that has overflown from the photodiode PD and stored in the storage capacitor FC. One electrode of the storage capacitor FC is electrically coupled, for example, to a power source VDD, and another electrode of the storage capacitor FC is electrically coupled to the drain of the overflow gate transistor OFG and the source of the storage capacitance transistor FCG. Photocharge stored in the storage capacitor FC is, for example, transferred to the floating diffusion FD via the storage capacitance transistor FCG, thereby being reflected to the pixel signal outputted from the pixel 2. The solid-state imaging device 1 is thus able to reflect the photocharge generated to exceed the saturation charge amount of the photodiode PD to the pixel signal. Accordingly, it is possible to further expand a dynamic range of the pixel signal.

The storage capacitance transistor FCG is turned on on the basis of a driving signal applied to the gate via the pixel driving line 10 to thereby transfer the photocharge stored in the storage capacitor FC to the floating diffusion FD. The source of the storage capacitance transistor FCG is electrically coupled to the storage capacitor FC and the drain of the overflow gate transistor OFG. A drain of the storage capacitance transistor FCG is electrically coupled to a source of the reset transistor RST and a gate of the amplifier transistor AMP.

The transfer gate transistor TGL is turned on on the basis of the driving signal applied to a gate via the pixel driving line 10 and thereby transfers the photocharge stored in the photodiode PD to the floating diffusion FD. The source of the transfer gate transistor TGL is electrically coupled to the cathode of the photodiode PD. A drain of the transfer gate transistor TGL is electrically coupled to the source of the reset transistor RST and the gate of the amplifier transistor AMP.

Here, the floating diffusion FD corresponds to wiring coupling the drain of the transfer gate transistor TGL, the drain of the storage capacitance transistor FCG, the source of the reset transistor RST, and the gate of the amplifier transistor AMP to each other. The floating diffusion FD holds the photocharge transferred from the photodiode PD via the transfer gate transistor TGL and the photocharge transferred from the storage capacitor FC via the storage capacitance transistor FCG that are stored in the floating diffusion FD, to thereby convert the stored photocharge into a voltage of a voltage value corresponding to a charge amount.

The reset transistor RST is turned on to thereby discharge the photocharge stored in the floating diffusion FD to the power source VDD and reset a potential of the floating diffusion FD to a predetermined potential (e.g., a potential of the power source VDD). The source of the reset transistor RST is electrically coupled to the drain of the transfer gate transistor TGL, the drain of the storage capacitance transistor FCG, and the gate of the amplifier transistor AMP. A drain of the reset transistor RST is electrically coupled to the power source VDD.

In the amplifier transistor AMP, a channel state is controlled in accordance with the charge amount of the photocharge stored in the floating diffusion FD. The amplifier transistor AMP is thus able to supply a pixel signal corresponding to the charge amount of the photocharge stored in the floating diffusion FD to the vertical signal line 9 from the drain. The gate of the amplifier transistor AMP is electrically coupled to the source of the reset transistor RST, the drain of the transfer gate transistor TGL, and the drain of the storage capacitance transistor FCG. The source of the amplifier transistor AMP is electrically coupled to the power source VDD. The drain of the amplifier transistor AMP is electrically coupled to the source of the selection transistor SEL.

The selection transistor SEL controls electrical conduction between the amplifier transistor AMP and the vertical signal line 9 to thereby control output of the pixel signal from the amplifier transistor AMP to the vertical signal line 9. A source of the select transistor SEL is electrically coupled to a drain of the amplifier transistor AMP. A drain of the select transistor SEL is electrically coupled to the vertical signal line 9.

The pixel 2 including the equivalent circuit illustrated in FIG. 2 may have, for example, a plan configuration illustrated in FIG. 3.

As illustrated in FIG. 3, the photodiode PD and the storage capacitor FC are provided to be stacked on each other. Specifically, the photodiode PD is provided inside a semiconductor substrate where the solid-state imaging device 1 is provided, and the storage capacitor FC is provided at a surface of the semiconductor substrate to be stacked on the photodiode PD. In addition, a point of electrical coupling to the power source VDD is provided adjacent to the storage capacitor FC. This allows one of the electrodes of the storage capacitor FC to be electrically coupled to the power source VDD.

The transfer gate transistor TGL and the overflow gate transistor OFG are provided in a first direction (a Y-direction in FIG. 3) in a plane of the semiconductor substrate with respect to the photodiode PD. In addition, the transfer gate transistor TGL and the overflow gate transistor OFG are provided to be arranged in a second direction (an X-direction in FIG. 3) orthogonal to the first direction in the plane of the semiconductor substrate.

The storage capacitance transistor FCG is provided between the transfer gate transistor TGL and the overflow gate transistor OFG arranged in the second direction. The drain of the transfer gate transistor TGL and the drain of the overflow gate transistor OFG are electrically coupled to each other via the storage capacitance transistor FCG.

Thus, the overflow gate transistor OFG is able to transfer the photocharge overflowing from the photodiode PD to a storage capacitance transistor FCG side of the second direction. The transferred photocharge is stored in the storage capacitor FC via wiring provided on the semiconductor substrate. In addition, the transfer gate transistor TGL is able to transfer the photocharge stored in the photodiode PD to the storage capacitance transistor FCG side of the second direction. The transferred photocharge is transferred to the gate of the amplifier transistor AMP and the source of the reset transistor RST via the wiring provided on the semiconductor substrate.

The reset transistor RST, the amplifier transistor AMP, and the selection transistor SEL are arranged to extend in the first direction in the plane of the semiconductor substrate with respect to the photodiode PD. A point of electrical coupling to the power source VDD is provided between the reset transistor RST and the amplifier transistor AMP, and the drain of the reset transistor RST and the drain of the amplifier transistor AMP are electrically coupled to the power source VDD.

In addition, the pixel 2 including the equivalent circuit illustrated in FIG. 2 may have, for example, a cross-sectional configuration illustrated in FIG. 4. Here, FIG. 4 illustrates a vertical cross-section taken along the section line A-AA in FIG. 3. It is to be noted that in FIG. 4, an X− diffusion region, an X+ diffusion region, and an X++ (X is P or N) diffusion region represent regions doped with a P-type or N-type impurity and have respective concentrations that are higher in order of the X− diffusion region, the X+ diffusion region, and the X++ diffusion region.

As illustrated in FIG. 4, a semiconductor substrate 100 including, for example, silicon (Si) is provided with N+ diffusion regions 101, 117, and 127, N++ diffusion regions 102 and 132, a P− diffusion region 103, and P++ diffusion regions 131, 142, and 143. In addition, the back surface side of the semiconductor substrate 100 is provided with a protective layer 151, a color filter 152, and an on-chip lens 153.

For example, the pixels 2 are electrically isolated from each other by a pixel isolation layer 141 having an insulation property and the P++ diffusion region 143. In a case where the pixel isolation layer 141 is provided to have a light blocking property, it is also possible to suppress light leakage between mutually-adjacent pixels 2. The P++ diffusion region 142 is provided as a pinning layer around the pixel isolation layer 141 in order to suppress a dark current caused by a defect that occurs on an interface between the pixel isolation layer 141 and the semiconductor substrate 100.

The photodiode PD includes a PN junction of the N+ diffusion region 101 and the N++ diffusion region 102 provided on the back surface side of the semiconductor substrate 100 and the P− diffusion region 103 provided on a front surface side of the semiconductor substrate 100.

The storage capacitor FC includes the N++ diffusion region 132 provided on the front surface side of the semiconductor substrate 100 and a capacitance electrode 135 provided on the surface of the semiconductor substrate 100 with an insulation film 134 interposed therebetween. The N++ diffusion region 132 serves as one of the electrodes of the storage capacitor FC, and the capacitance electrode 135 serves as the other of the electrodes of the storage capacitor FC. The insulation film 134 includes, for example, a silicon oxide ($SiO_x$) or the like. The storage capacitor FC and, for example, other transistors are electrically isolated from each other by a device isolation layer 133 having an insulation property.

It is to be noted that the P++ diffusion region 131 is provided between the N++ diffusion region 132 and the P− diffusion region 103 in order to electrically isolate the storage capacitor FC and the photodiode PD from each other.

The overflow gate transistor OFG includes: a gate electrode 125 provided on the surface of the semiconductor substrate 100 with a gate insulation film 124 interposed therebetween; the N++ diffusion region 102 serving as the source; and the N+ diffusion region 127 serving as the drain. That is, the overflow gate transistor OFG is provided as a so-called planar transistor in which the gate electrode 125 is provided in a flat manner on the surface of the semiconductor substrate 100.

The transfer gate transistor TGL includes a gate electrode, the N++ diffusion region 102 serving as the source, and the N+ diffusion region 117 serving as the drain. The gate electrode includes a surface electrode 115 and a digging electrode 116. The surface electrode 115 is provided on the surface of the semiconductor substrate 100 with the gate insulation film 124 interposed therebetween. The digging electrode 116 is provided by digging the surface of the semiconductor substrate 100. That is, the transfer gate transistor TGL is provided as a so-called vertical transistor in which the gate electrode is provided to extend in a thickness direction of the semiconductor substrate 100.

As described above, in the solid-state imaging device 1 according to the present embodiment, the transfer gate transistor TGL is provided as a vertical transistor. This makes it possible for the transfer gate transistor TGL to more easily transfer the photocharge generated by the photodiode PD inside the semiconductor substrate 100 by means of the floating diffusion FD provided at the surface of the semiconductor substrate 100.

Meanwhile, in the solid-state imaging device 1 according to the present embodiment, the overflow gate transistor OFG is provided as a planar transistor. The overflow gate transistor OFG is provided to have a potential of a channel deeper than that of the transfer gate transistor TGL in order to form an overflow pass for the photocharge, and an off voltage is applied to the overflow gate transistor OFG in a relatively moderate manner (i.e., a relatively week negative bias is applied). In such a case, it may be difficult to obtain pinning at the overflow gate transistor OFG for suppressing a dark current at an interface between the gate insulation film 114 and the semiconductor substrate 100.

In the solid-state imaging device 1 according to the present embodiment, providing the overflow gate transistor OFG as a planar transistor makes it possible to reduce the area of the interface between the gate insulation film 114 and the semiconductor substrate 100, as compared with a vertical transistor. Accordingly, the solid-state imaging device 1 is able to suppress an increase in the dark current at the overflow gate transistor OFG. In addition, by suppressing the dark current flowing into the drain side of the overflow gate transistor OFG provided with the storage capacitor FC that stores the photocharge, the solid-state imaging device 1 is able to suppress an influence of the dark current on signal charge outputted from the storage capacitor FC.

As described above, in the solid-state imaging device 1 according to the present embodiment, the photodiode PD and the storage capacitor FC are provided to be stacked on each other in the thickness direction of the semiconductor substrate 100, and the overflow gate transistor OFG is provided as a planar transistor. Accordingly, the solid-state imaging device 1 according to the present embodiment is able to suppress generation of the dark current while securing transfer of the photocharge overflowing from the photodiode PD to the storage capacitor FC.

(1.3. Examples of Plan Shape of Gate Electrode of Overflow Gate Transistor)

Next, referring to FIG. 5, a more specific description is given of a plan shape of the gate electrode 125 of the overflow gate transistor OFG. FIG. 5 is a plan view of an example of the plan shape of the gate electrode 125 of the overflow gate transistor OFG. FIG. 5 corresponds to an enlarged plan view of a periphery of the overflow gate transistor OFG illustrated in FIG. 3.

As illustrated in FIG. 5, the overflow gate transistor OFG is arranged in the first direction (a Y-direction in FIG. 5) in the plane of the semiconductor substrate 100 with respect to the photodiode PD. In addition, the overflow gate transistor OFG transfers the photocharge overflowing from the photodiode PD in a second direction (an X-direction in FIG. 5) that is orthogonal to the first direction in the plane of the semiconductor substrate 100, to thereby store the photocharge in the storage capacitor FC via the wiring on the semiconductor substrate 100.

In this case, in order to transfer the photocharge in the second direction more smoothly with a shorter path, the gate electrode 125 of the overflow gate transistor OFG is preferably provided not in a rectangular shape but in a polygonal shape obtained by removing a portion from a rectangular shape.

Specifically, the gate electrode 125 may be provided in a trapezoidal shape in a wide sense obtained by removing a portion from a rectangular shape to include at least two sides opposed to each other in parallel. For example, the gate electrode 125 may be provided in a polygonal shape obtained by removing, from a rectangular shape, a corner that is present on a side, of the second direction, in a transfer direction of the photocharge and on an opposite side, of the first direction, to a side opposed to the photodiode PD. With the gate electrode 125 having such a plan shape, the overflow gate transistor OFG is able to transfer the photocharge in the second direction more smoothly with a shorter path by appropriately controlling a potential generated at the semiconductor substrate 100. It is to be noted that a line by which the corner is removed may include a single straight line or may include a plurality of straight lines.

It is to be noted that the plan shape of the gate electrode 125 is not particularly limited in the shape on an opposite side to the side, of the second direction, in the transfer direction of the photocharge. For example, the shape of the gate electrode 125 on the opposite side to the side, of the second direction, in the transfer direction of the photocharge may be a shape having two right-angled vertices, may be a shape having three or more obtuse-angle vertices, or may be an arc shape.

(1.4. Modifications)
(First Modification)

Next, referring to FIGS. 6 and 7, a description is given of a solid-state imaging device 1 according to a first modification of the present embodiment. FIG. 6 is a circuit diagram illustrating an equivalent circuit of a pixel 21 included in the solid-state imaging device 1 according to the first modification. FIG. 7 is a circuit diagram illustrating an equivalent circuit of a pixel 22 included in the solid-state imaging device 1 according to the first modification.

As illustrated in FIGS. 6 and 7, the pixels 21 and 22 in the solid-state imaging device 1 according to the first modification differ from the pixel 2 described with reference to FIGS. 2 to 4 in that a conversion-efficiency switching transistor FDG is further provided.

The conversion-efficiency switching transistor FDG is provided in wiring included in the floating diffusion FD. Switching of the conversion-efficiency switching transistor FDG between an ON state and an OFF state allows for switching of a capacitance size of the floating diffusion FD. This allows for switching of efficiency of conversion from the photocharge into a voltage performed by the floating diffusion FD.

Specifically, the conversion-efficiency switching transistor FDG may be provided in wiring that electrically couples the drain of the transfer gate transistor TGL, the source of the reset transistor RST, and the gate of the amplifier transistor AMP to each other. Thus, by being switched between the ON state and the OFF state, the conversion-efficiency switching transistor FDG is able to switch contribution or non-contribution of the wiring between the conversion-efficiency switching transistor FDG and the reset transistor RST to the capacitance of the floating diffusion FD.

It is to be noted that the drain of the storage capacitance transistor FCG may be electrically coupled to the source of the conversion-efficiency switching transistor FDG as illustrated in FIG. 6, or may be electrically coupled to the drain of the conversion-efficiency switching transistor FDG as illustrated in FIG. 7.

(Second Modification)

Next, referring to FIGS. 8 and 9, a description is given of a solid-state imaging device 1 according to a second modification of the present embodiment. FIG. 8 is a circuit diagram illustrating an equivalent circuit of multiple pixels 2 included in the solid-state imaging device 1 according to the second modification. FIG. 9 is a plan view of a plan configuration of the multiple pixels 2 included in the solid-state imaging device 1 according to the second modification.

As illustrated in FIG. 8, the solid-state imaging device 1 according to the second modification differs from the pixel 2 described with reference to FIGS. 2 to 4 in that the drains of the transfer gate transistors TGL of the respective multiple pixels 2 are electrically coupled to the floating diffusion FD. Thus, the floating diffusion FD is able to store the photocharge generated by each of the multiple photodiodes PD and convert the photocharge generated by each of the multiple photodiodes PD into a pixel signal. That is, in the solid-state imaging device 1 according to the second modification, the floating diffusion FD and the reset transistor RST, the amplifier transistor AMP, and the selection transistor SEL thereafter are shared by the multiple pixels 2.

As illustrated in FIG. 9, the drains of the transfer gate transistors TGL and the drains of the storage capacitance transistors FCG of the respective multiple pixels 2 are electrically coupled to each other by wiring provided on the surface of the semiconductor substrate 100, to thereby form the floating diffusion FD. The floating diffusion FD is electrically coupled to the gate of one amplifier transistor AMP and the source of the reset transistor RST to convert the photocharge stored in the floating diffusion FD into a pixel signal. That is, the reset transistor RST, the amplifier transistor AMP, and the selection transistor SEL are each provided on a one-to-one basis for the multiple pixels 2 sharing the floating diffusion FD.

A plan arrangement of the photodiode PD, the transfer gate transistor TGL, the overflow gate transistor OFG, the storage capacitor FC, and the storage capacitance transistor FCG in each of the pixels 2 is similar to the plan arrangement illustrated in FIG. 3, and a description thereof is therefore omitted here.

It is to be noted that although FIGS. 8 and 9 illustrate an example in which the floating diffusion FD and the reset transistor RST, the amplifier transistor AMP, and the selection transistor SEL thereafter are shared by two pixels 2, the second modification is not limited to such an example. The number of the pixels 2 sharing the floating diffusion FD and the circuit thereafter does not have a particular upper limit as long as it is two or more. For example, the number of the pixels 2 sharing the floating diffusion FD and the circuit thereafter may be four, six, or eight.

2. Second Embodiment (2.1. Configuration Example of Pixel)

Next, referring to FIGS. 10 to 12, a description is given of a pixel 2A included in a solid-state imaging device 1 according to a second embodiment of the present disclosure. FIG. 10 is a circuit diagram illustrating an equivalent circuit of the pixel 2A in the solid-state imaging device 1 according to the present embodiment. FIG. 11 is a plan view of a plan configuration of the pixel 2A in the solid-state imaging device 1 according to the present embodiment. FIG. 12 is a vertical cross-sectional view of a cross-sectional configuration of the pixel 2A in the solid-state imaging device 1 according to the present embodiment.

As illustrated in FIG. 10, the pixel 2A of the solid-state imaging device 1 according to the present embodiment includes a photodiode PD, an overflow gate transistor OFG, a transfer gate transistor TGL, a reset transistor RST, an amplifier transistor AMP, and a selection transistor SEL. That is, the pixel 2A according to the second embodiment differs from the pixel 2 according to the first embodiment in that no storage capacitor FC is provided and photocharge overflowing from the photodiode PD is discharged to a power source VDD.

The photodiode PD, the transfer gate transistor TGL, the reset transistor RST, the amplifier transistor AMP, and the selection transistor SEL are substantially similar to those in the first embodiment, and a description thereof is therefore omitted here.

The overflow gate transistor OFG discharges the photocharge overflowing from the photodiode PD to the power source VDD. A source of the overflow gate transistor OFG is electrically coupled to a cathode of the photodiode PD. A drain of the overflow gate transistor OFG is electrically coupled to the power source VDD.

The overflow gate transistor OFG is provided to have a potential of a channel deeper than that of the transfer gate transistor TGL (in other words, so that the potential of the channel shifts more in a positive direction), thereby forming an overflow path of the photocharge from the photodiode PD. Thus, in a case where photocharge more than a saturation charge amount is generated by the photodiode PD, the solid-state imaging device 1 is able to discharge the photocharge exceeding the saturation charge amount to the power source VDD via the overflow gate transistor OFG. Accordingly, the solid-state imaging device 1 is able to prevent the photocharge generated by the photodiode PD to exceed the saturation charge amount from becoming a noise source for another adjacent pixel 2A.

The pixel 2A including the equivalent circuit illustrated in FIG. 10 may have, for example, a plan configuration illustrated in FIG. 11.

As illustrated in FIG. 11, the transfer gate transistor TGL and the overflow gate transistor OFG are provided in the first direction (a Y-direction in FIG. 11) in a plane of the semiconductor substrate with respect to the photodiode PD.

The overflow gate transistor OFG is provided with a point of electrical coupling to the power source VDD, and the drain of the overflow gate transistor OFG is electrically coupled to the power source VDD. Thus, the overflow gate transistor OFG is able to discharge the photocharge overflowing from the photodiode PD to the power source VDD.

A drain of the transfer gate transistor TGL is electrically coupled to a gate of the amplifier transistor AMP via wiring provided on the semiconductor substrate. Thus, the transfer gate transistor TGL is able to transfer the photocharge stored in the photodiode PD to the gate of the amplifier transistor AMP.

The reset transistor RST, the amplifier transistor AMP, and the selection transistor SEL are arranged to extend in the first direction in the plane of the semiconductor substrate with respect to the photodiode PD. A point of electrical coupling to the power source VDD is provided between the reset transistor RST and the amplifier transistor AMP, and a drain of the reset transistor RST and a drain of the amplifier transistor AMP are electrically coupled to the power source VDD.

It is to be noted that at least one or more transistors in a pixel transistor group including the reset transistor RST, the amplifier transistor AMP, and the selection transistor SEL described above, and the photodiode PD may be provided to be stacked on each other. The photodiode PD is provided inside the semiconductor substrate. Therefore, it is possible to provide, for example, the transistors on the front surface side of the semiconductor substrate in a region provided with the photodiode PD. Thus, the solid-state imaging device 1 makes it possible to further expand the region occupied by the photodiode PD in the pixel 2A (i.e., makes it possible to further increase an opening rate).

In addition, the pixel 2A including the equivalent circuit illustrated in FIG. 10 may have, for example, a cross-sectional configuration illustrated in FIG. 12. In FIG. 12, an X− diffusion region, an X+ diffusion region, and an X++ (X is P or N) diffusion region represent regions doped with a P-type or N-type impurity and have respective concentrations that are higher in order of the X− diffusion region, the X+ diffusion region, and the X++ diffusion region.

As illustrated in FIG. 12, a semiconductor substrate 100 including, for example, silicon (Si) is provided with N+ diffusion regions 101, 117, 127, and 166, an N+ diffusion region 102, P− diffusion regions 103 and 167, and P++ diffusion regions 142, 143, and 161. In addition, the back surface side of the semiconductor substrate 100 is provided with a protective layer 151, a color filter 152, and an on-chip lens 153.

For example, the pixels 2A are electrically isolated from each other by a pixel isolation layer 141 having an insulation property and the P++ diffusion region 143. In a case where the pixel isolation layer 141 is provided to have a light blocking property, it is also possible to suppress light leakage between mutually-adjacent pixels 2A. The P++ diffusion region 142 is provided as a pinning layer around the pixel isolation layer 141 in order to suppress a dark current caused by a defect occurring on an interface between the pixel isolation layer 141 and the semiconductor substrate 100.

The photodiode PD includes a PN junction of the N+ diffusion region 101 and the N++ diffusion region 102 provided on the back surface side of the semiconductor substrate 100 and the P− diffusion region 103 provided on a front surface side of the semiconductor substrate 100.

At least one or more transistors in the pixel transistor group each include the P− diffusion region 167 and the N+ diffusion region 166 provided on the front surface side of the semiconductor substrate 100; and a gate electrode 165 provided on the surface of the semiconductor substrate 100 with the gate insulation film 164 interposed therebetween. The N+ diffusion region 166 serves as a source or a drain of the transistor, and the P− diffusion region 167 serves as a channel of the transistor. The gate insulation film 164 includes, for example, silicone oxide ($SiO_x$).

It is to be noted that the P++ diffusion region 161 is provided between the P− diffusion region 167 and the N+ diffusion region 166, and the P− diffusion region 103 in order to electrically isolate the at least one or more transistors in the pixel transistor group and the photodiode PD from each other. The transistors included in the pixel transistor group are electrically isolated from each other by an element isolation layer 163 having an insulation property.

The overflow gate transistor OFG includes: a gate electrode 125 provided on the surface of the semiconductor substrate 100 with a gate insulation film 124 interposed therebetween; the N++ diffusion region 102 serving as the source; and the N+ diffusion region 127 serving as the drain. That is, the overflow gate transistor OFG is provided as a so-called planar transistor in which the gate electrode 125 is provided in a flat manner on the surface of the semiconductor substrate 100.

The transfer gate transistor TGL includes a gate electrode, the N++ diffusion region 102 serving as a source, and the N+ diffusion region 117 serving as the drain. The gate electrode includes a surface electrode 115 and a digging electrode 116. The surface electrode 115 is provided on the surface of the semiconductor substrate 100 with the gate insulation film 124 interposed therebetween. The digging electrode 116 is provided by digging the surface of the semiconductor substrate 100. That is, the transfer gate transistor TGL is provided as a so-called vertical transistor in which the gate electrode is provided to extend in a thickness direction of the semiconductor substrate 100.

In the solid-state imaging device 1 according to the present embodiment, the transfer gate transistor TGL is provided as a vertical transistor. As with the first embodiment, this makes it possible for the solid-state imaging device 1 to more easily transfer the photocharge generated by the photodiode PD inside the semiconductor substrate 100 by means of the floating diffusion FD provided at the surface of the semiconductor substrate 100. In addition, in the solid-state imaging device 1 according to the present embodiment, the overflow gate transistor OFG is provided as a planar transistor. Thus, as with the first embodiment, the solid-state imaging device 1 is able to suppress an increase in the dark current at the overflow gate transistor OFG. Accordingly, the solid-state imaging device 1 according to the present embodiment is able to suppress generation of the dark current while securing discharging of the photocharge overflowing from the photodiode PD to the power source VDD.

(2.2. Modifications)
(First Modification)

Next, referring to FIG. 13, a description is given of a solid-state imaging device 1 according to a first modification of the present embodiment. FIG. 13 is a circuit diagram illustrating an equivalent circuit of a pixel 23 included in the solid-state imaging device 1 according to the first modification.

As illustrated in FIG. 13, the pixel 23 in the solid-state imaging device 1 according to the first modification differs from the pixel 2A described with reference to FIGS. 10 to 12 in that a conversion-efficiency switching transistor FDG is further provided.

The conversion-efficiency switching transistor FDG is provided in wiring included in the floating diffusion FD. Switching of the conversion-efficiency switching transistor FDG between an ON state and an OFF state allows for switching of a capacitance size of the floating diffusion FD. This allows for switching of efficiency of conversion from the photocharge into a voltage performed by the floating diffusion FD.

Specifically, the conversion-efficiency switching transistor FDG may be provided in wiring that electrically couples the drain of the transfer gate transistor TGL, the source of the reset transistor RST, and the gate of the amplifier transistor AMP to each other. Thus, by being switched between the ON state and the OFF state, the conversion-efficiency switching transistor FDG is able to switch contribution or non-contribution of the wiring between the conversion-efficiency switching transistor FDG and the reset transistor RST to the capacitance of the floating diffusion FD.

(Second Modification)

Next, referring to FIGS. 14 and 15, a description is given of a solid-state imaging device 1 according to a second modification of the present embodiment. FIG. 14 is a circuit diagram illustrating an equivalent circuit of multiple pixels 2A included in the solid-state imaging device 1 according to the second modification. FIG. 15 is a plan view of a plan configuration of the multiple pixels 2A included in the solid-state imaging device 1 according to the second modification.

As illustrated in FIG. 14, the solid-state imaging device 1 according to the second modification differs from the pixel 2A described with reference to FIGS. 10 to 12 in that the drains of the transfer gate transistors TGL of the respective multiple pixels 2A are electrically coupled to the floating diffusion FD. Thus, the floating diffusion FD is able to store the photocharge generated by each of the multiple photodiodes PD and convert the photocharge generated by each of the multiple photodiodes PD into a pixel signal. That is, in the solid-state imaging device 1 according to the second modification, the floating diffusion FD and the reset transistor RST, the amplifier transistor AMP, and the selection transistor SEL thereafter are shared by the multiple pixels 2A.

As illustrated in FIG. 15, the drains of the transfer gate transistors TGL of the respective multiple pixels 2A are electrically coupled to each other by wiring provided on the surface of the semiconductor substrate 100, to thereby form the floating diffusion FD. The floating diffusion FD is electrically coupled to the gate of one amplifier transistor AMP and the source of the reset transistor RST to convert the photocharge stored in the floating diffusion FD into a pixel signal. Thus, the reset transistor RST, the amplifier transistor AMP, and the selection transistor SEL are each provided on a one-to-one basis for the multiple pixels 2A sharing the floating diffusion FD.

A plan arrangement of the photodiode PD, the transfer gate transistor TGL, and the overflow gate transistor OFG in each of the pixels 2A is similar to the plan arrangement illustrated in FIG. 11, and a description thereof is therefore omitted here.

It is to be noted that although FIGS. 14 and 15 illustrate an example in which the floating diffusion FD and the reset transistor RST, the amplifier transistor AMP, and the selection transistor SEL thereafter are shared by two pixels 2A, the second modification is not limited to such an example. The number of the pixels 2A sharing the floating diffusion FD and the circuit thereafter does not have a particular upper limit as long as it is two or more. For example, the number of the pixels 2A sharing the floating diffusion FD and the circuit thereafter may be four, six, or eight.

3. Application Examples

The technology according to the present disclosure is not limited to the above-described embodiments, and is applicable to other embodiments.
(Application to Electronic Apparatus)

The technology according to the present disclosure is applicable to a general electronic apparatus including a solid-state imaging device, such as: a camera module including an optical lens system or the like in addition to the solid-state imaging device; an imaging apparatus such as a digital still camera or a video camera; a portable terminal apparatus having an imaging function (e.g., a smart phone or a tablet terminal); or a copier in which the solid-state imaging device is used as an image reader.

FIG. 16 is a block diagram illustrating a configuration example of an electronic apparatus 1000 including the solid-state imaging device 1 according to any of the embodiments and modifications described above.

As described above, the electronic apparatus 1000 is, for example, an electronic apparatus such as: an imaging apparatus such as a digital still camera or a video camera; or a portable terminal apparatus such as a smart phone or a tablet terminal.

As illustrated in FIG. 16, the electronic apparatus 1000 includes, for example, the solid-state imaging device 1 according to any of the embodiments and modifications described above, a DSP (Digital Signal Processor) circuit 210, a frame memory 220, a display unit 230, a storage unit 240, an operation unit 250, and a power source unit 260. The DSP circuit 210, the frame memory 220, the display unit 230, the storage unit 240, the operation unit 250, and the power source unit 260 are coupled to each other via a bus line 270.

The solid-state imaging device 1 outputs image data corresponding to incident light. The DSP circuit 210 is a circuit that performs signal processing on the image data supplied from the solid-state imaging device 1. The frame memory 220 is a storage device that temporarily holds the image data that has been subjected to the signal processing by the DSP circuit 210 on a frame-unit basis. The display unit 230 includes, for example, a liquid crystal display device or an OLED (Organic Light Emitting Diode) display device, and displays a moving image or a still image captured by the solid-state imaging device 1 on the basis of the image data. The storage unit 240 is a storage device that holds as a semiconductor memory or a hard disk drive that holds the image data of the moving image or the still image captured by the solid-state imaging device 1. The operation unit 250 is an input device that outputs operation instructions for various functions of the electronic apparatus 1000 on the basis of an operation performed by a user. The power source unit 260 is an operation power source for the DSP circuit 210, the frame memory 220, the display unit 230, the storage unit 240, and the operation unit 250 to appropriately supply electric power to each of the units.
(Application to Mobile Body)

For example, the technology according to the present disclosure may be implemented as a device mounted on any kind of mobile body such as an automobile, an electric vehicle, a hybrid electric vehicle, a motorcycle, a bicycle, a personal mobility, an airplane, a drone, a vessel, or a robot.

FIG. 17 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 17, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 17, an audio speaker 12061, a display section 12062, and an instrument panel 12063 are illustrated as the output device. The display section 12062 may, for example, include at least one of an on-board display and a head-up display.

FIG. 18 is a diagram depicting an example of the installation position of the imaging section 12031.

In FIG. 18, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 18 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

A description has been given above of an example of the vehicle control system to which the technology according to the present disclosure is applicable. The technology according to the present disclosure is applicable to, for example, the imaging section 12031 among the above-described configurations. Application of the technology according to the present disclosure to the imaging section 12031 makes it possible to obtain an imaging image with less noise caused by a dark current. Therefore, the microcomputer 12051 is able to perform, for example, automatic driving more appropriate for an external environment.

(Application to Endoscopic Surgery System)

For example, the technology according to the present disclosure may be applied to an endoscopic surgery system.

FIG. 19 is a view depicting an example of a schematic configuration of an endoscopic surgery system to which the technology according to an embodiment of the present disclosure (present technology) can be applied.

In FIG. 19, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 20 is a block diagram depicting an example of a functional configuration of the camera head 11102 and the CCU 11201 depicted in FIG. 19.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

A description has been given above of an example of the endoscopic surgery system to which the technology according to the present disclosure is applicable. The technology according to the present disclosure is applicable to, for example, the endoscope 11100 or the image pickup unit 11402 of the camera head 11102 among the above-described configurations. Application of the technology according to the present disclosure to the image pickup unit 11402 makes it possible to obtain an imaging image with less noise caused by a dark current. Therefore, it is possible to secure confirmation of an operation part by an operator.

It is to be noted that although the description has been given of the endoscopic surgery system here as an example, the technology according to the present disclosure may be applied, for example, to another surgery system such as a microscope surgery system.

The technology according to the present disclosure has been described above with reference to the first and second embodiments and the modifications. However, the technology according to the present disclosure is not limited to the above-described embodiments and the like and various modifications are possible.

Furthermore, not all the configurations and the operations described in each of the embodiments are essential to the configurations and the operations of the present disclosure. For example, among the components in each of the embodiments, components not described in the independent claims describing the most superordinate concept of the present disclosure should be understood as optional components.

The terms used throughout the specification and the appended claims should be construed as "non-limiting" terms. For example, the terms "include" or "be included" should be construed as "not limited to the example described with the term included". The term "have" should be construed as "not limited to the example described with the term have".

The terms used herein include some terms that are used merely for convenience of description and are not used to limit the configuration and the operation. For example, the term such as "right," "left," "upper," or "lower" merely indicates a direction on the referred drawing. Further, the terms "inner" and "outer" merely indicate a direction toward the center of the component of interest and a direction away from the center of the component of interest, respectively. This similarly applies to terms similar to the above-described terms and terms having similar meanings.

It is to be noted that the technology according to the present disclosure may have the following configurations. According to the technology of the present disclosure having the following configurations, the transfer gate transistor is provided as a vertical transistor and the overflow gate transistor is provided as a planar transistor. This reduces the area of the interface between the gate insulation film and the semiconductor substrate that is to be a cause of the dark current. Accordingly, the solid-state imaging device is able to suppress generation of the dark current. Effects exerted by the technology according to the present disclosure are not necessarily limited to the effects described here, and may be any of the effects described in the present disclosure.

(1)

A solid-state imaging device including:
- a photoelectric converter that is provided in a semiconductor substrate and generates photocharge;
- a transfer gate transistor that is provided at a surface of the semiconductor substrate as a vertical transistor and reads the photocharge stored in the photoelectric converter; and
- an overflow gate transistor that is provided at the surface of the semiconductor substrate as a planar transistor and transfers the photocharge overflowing from the photoelectric converter.

(2)

The solid-state imaging device according to (1) described above, further including a storage capacitor that is provided to be stacked on the photoelectric converter in a thickness direction of the semiconductor substrate and stores the photocharge transferred by the overflow gate transistor.

(3)

The solid-state imaging device according to (2) described above, in which the storage capacitor includes the semiconductor substrate and a capacitance electrode provided on the surface of the semiconductor substrate with an insulation layer interposed therebetween.

(4)

The solid-state imaging device according to (2) or (3) described above, further including
- a floating diffusion in which the photocharge read by the transfer gate transistor is stored, in which
- the storage capacitor is electrically coupled to the floating diffusion via a storage capacitance transistor.

(5)

The solid-state imaging device according to (1) described above, further including
- a pixel transistor group that converts the photocharge into a pixel signal, in which
- at least one or more transistors included in the pixel transistor group are provided to be stacked on the photoelectric converter in a thickness direction of the semiconductor substrate.

(6)

The solid-state imaging device according to (5) described above, in which the pixel transistor group includes at least one or more of an amplifier transistor, a reset transistor, or a selection transistor.

(7)

The solid-state imaging device according to any one of (1) to (6) described above, further including
a floating diffusion in which the photocharge read by the transfer gate transistor is stored, in which
the floating diffusion includes a conversion-efficiency switching transistor that switches a capacitance size of the floating diffusion.

(8)

The solid-state imaging device according to (7) described above, in which the floating diffusion holds the photocharge read from each of the multiple photoelectric converters and stored in the floating diffusion.

(9)

The solid-state imaging device according to any one of (1) to (8) described above, in which a planar gate electrode of the overflow gate transistor has a polygonal shape including at least two sides opposed to each other in parallel.

(10)

The solid-state imaging device according to (9) described above, in which
the overflow gate transistor is arranged in a first direction in a plane of the semiconductor substrate with respect to the photoelectric converter, and transfers the photocharge from the photoelectric converter in a second direction that is orthogonal to the first direction in the plane of the semiconductor substrate, and
the planar gate electrode has a shape obtained by removing, from a rectangular shape, a corner that is present on a side, of the second direction, in a transfer direction of the photocharge and on an opposite side, of the first direction, to a side opposed to the photoelectric converter.

(11)

The solid-state imaging device according to any one of (1) to (10) described above, in which
the overflow gate transistor transfers the photocharge upon a storage operation, and
the transfer gate transistor reads the photocharge upon a reading operation of reading the photocharge stored upon the storage operation.

(12)

The solid-state imaging device according to any one of (1) to (11) described above, in which a potential of a channel of the overflow gate transistor is deeper than a potential of a channel of the transfer gate transistor.

This application claims the priority on the basis of Japanese Patent Application No. 2020-088488 filed on May 20, 2020 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A solid-state imaging device, comprising:
a photoelectric converter of a plurality of photoelectric converters in a semiconductor substrate,
wherein the photoelectric converter is configured to generate a photocharge;
a transfer gate transistor as a vertical transistor, wherein
the transfer gate transistor is at a surface of the semiconductor substrate, and
the transfer gate transistor is configured to read the photocharge from the photoelectric converter; and
an overflow gate transistor as a planar transistor, wherein
the overflow gate transistor is at the surface of the semiconductor substrate,
the overflow gate transistor is configured to transfer the photocharge that overflows from the photoelectric converter,
an arrangement of the overflow gate transistor is in a first direction in a plane of the semiconductor substrate with respect to the photoelectric converter,
the transfer of the photocharge is in a second direction orthogonal to the first direction in the plane of the semiconductor substrate,
the overflow gate transistor includes a planar gate electrode that has a polygonal shape including at least two sides,
a first side of the at least two sides of the polygonal shape is opposite to a second side of the at least two sides of the polygonal shape,
the first side of the polygonal shape is parallel to the second side of the polygonal shape,
the planar gate electrode has the polygonal shape in which a corner is removed from a rectangular shape,
the corner is on a first side of the rectangular shape in the second direction,
the photoelectric converter is on a second side of the rectangular shape in the first direction, and
in the first direction, the corner is on a third side of the rectangular shape opposite to the second side of the rectangular shape.

2. The solid-state imaging device according to claim 1, further comprising a storage capacitor on the photoelectric converter in a thickness direction of the semiconductor substrate,
wherein the storage capacitor is configured to store the photocharge transferred by the overflow gate transistor.

3. The solid-state imaging device according to claim 2, wherein the storage capacitor includes:
the semiconductor substrate;
a capacitance electrode on the surface of the semiconductor substrate; and
an insulation layer between the semiconductor substrate and the capacitance electrode.

4. The solid-state imaging device according to claim 2, further comprising:
a storage capacitance transistor; and
a floating diffusion configured to store the photocharge read by the transfer gate transistor,
wherein the storage capacitor is electrically coupled to the floating diffusion via the storage capacitance transistor.

5. The solid-state imaging device according to claim 1, further comprising a pixel transistor group configured to convert the photocharge into a pixel signal,
wherein the pixel transistor group is on the photoelectric converter in a thickness direction of the semiconductor substrate.

6. The solid-state imaging device according to claim 5, wherein the pixel transistor group includes at least one of an amplifier transistor, a reset transistor, or a selection transistor.

7. The solid-state imaging device according to claim 1, further comprising a floating diffusion configured to store the photocharge read by the transfer gate transistor,
- wherein the floating diffusion includes a conversion-efficiency switching transistor configured to change a capacitance size of the floating diffusion.

8. The solid-state imaging device according to claim 7, further comprising the plurality of photoelectric converters, wherein
- each photoelectric converter of the plurality of photoelectric converters is configured to generate the photocharge,
- the transfer gate transistor is further configured to read the photocharge from each photoelectric converter of the plurality of photoelectric converters, and
- the floating diffusion is further configured to hold the photocharge read from each photoelectric converter of the plurality of photoelectric converters.

9. The solid-state imaging device according to claim 1, wherein
- the overflow gate transistor is further configured to transfer the photocharge based on a storage operation, and
- the transfer gate transistor is further configured to read the photocharge based on a reading operation to read the photocharge.

10. The solid-state imaging device according to claim 1, wherein a potential of a channel of the overflow gate transistor is deeper than a potential of a channel of the transfer gate transistor.

\* \* \* \* \*